United States Patent
Iseki et al.

(10) Patent No.: US 10,606,177 B2
(45) Date of Patent: Mar. 31, 2020

(54) SUBSTRATE PROCESSING APPARATUS, SUBSTRATE PROCESSING METHOD, AND STORAGE MEDIUM

(71) Applicant: TOKYO ELECTRON LIMITED, Tokyo (JP)

(72) Inventors: Tomohiro Iseki, Kumamoto (JP); Keiichi Tanaka, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/029,931

(22) Filed: Jul. 9, 2018

(65) Prior Publication Data

US 2019/0025704 A1   Jan. 24, 2019

(30) Foreign Application Priority Data

Jul. 19, 2017   (JP) .................... 2017-140100

(51) Int. Cl.
*G03F 7/40*    (2006.01)
*H01L 21/027*  (2006.01)

(52) U.S. Cl.
CPC ............ *G03F 7/40* (2013.01); *H01L 21/0274* (2013.01)

(58) Field of Classification Search
CPC ................................ G03F 7/40; H01L 21/0274
USPC ................ 250/492.1, 493.1, 504 R
See application file for complete search history.

(56) References Cited

U.S. PATENT DOCUMENTS

| 2002/0126269 A1* | 9/2002 | Sato ................... G03F 7/70058 355/77 |
| 2005/0260107 A1* | 11/2005 | Jackson ................... A61L 2/14 422/136 |
| 2010/0209855 A1* | 8/2010 | Tanaka .................... G03F 7/38 430/319 |
| 2014/0220489 A1* | 8/2014 | Kozuma ................... G03F 7/40 430/270.1 |

FOREIGN PATENT DOCUMENTS

JP       2001127037 A    5/2001

* cited by examiner

*Primary Examiner* — Nicole M Ippolito
(74) *Attorney, Agent, or Firm* — Nath, Goldberg & Meyer; Jerald L. Meyer

(57) ABSTRACT

There is provided a substrate processing apparatus, including: a mounting table configured to mount a substrate with a pattern mask formed on the substrate inside a process container; a depressurization mechanism configured to perform a pressure-decreasing process of depressurizing an interior of the process container to have a pressure of 1 Pa or lower; a light irradiation mechanism configured to irradiate the substrate with a vacuum ultraviolet light after the interior of the process container is depressurized so that an internal pressure of the process container reaches a pressure of 1 Pa or lower; and a controller configured to output a control signal such that an average depressurization rate inside the process container performed by the depressurization mechanism becomes 250 Pa/sec or lower while the interior of the process container is depressurized from 10,000 Pa to 1 Pa.

10 Claims, 23 Drawing Sheets

SUBSTRATE PROCESSING APPARATUS, SUBSTRATE PROCESSING METHOD, AND STORAGE MEDIUM

CROSS-REFERENCE TO RELATED APPLICATION

This application is based on and claims the benefit of priority from Japanese Patent Application No. 2017-140100, filed on Jul. 19, 2017, the entire contents of which are incorporated herein by reference.

TECHNICAL FIELD

The present disclosure relates to a technique of improving roughness of a pattern mask formed on a surface of a substrate.

BACKGROUND

In a semiconductor device manufacturing process, a resist film is formed on a surface of a substrate such as a semiconductor wafer (hereinafter, referred to as a "wafer") and then is exposed. Thereafter, the wafer is subjected to a developing process so that a resist pattern is formed on the surface of the wafer. Subsequently, an underlayer film of the resist film is etched using the resist pattern as a pattern mask to form a pattern on the underlayer film.

Incidentally, roughness, i.e., unevenness, may exist on the surface of the resist pattern. Such a roughness of the resist pattern may have an adverse effect on the shape of the pattern of the underlayer film during etching. To address this, there is a case where a process of improving the roughness is performed. For example, there is known a technique for suppressing the roughness of a surface of a resist pattern by irradiating the surface with radiation having a wavelength of 200 nm or less in an atmosphere where an ozone concentration is lower than a predetermined concentration. However, as will be described in detail later, when vacuuming the periphery of the substrate in order to form such an atmosphere, the resist pattern may not have the desired overall shape, which makes it impossible for the resist pattern to function as the pattern mask.

SUMMARY

The present disclosure provides some embodiments of a technique capable of improving roughness of a surface of a mask pattern and suppressing a change in the overall shape of the mask pattern.

According to one embodiment of the present disclosure, there is provided a substrate processing apparatus, including: a mounting table configured to mount a substrate with a pattern mask formed on the substrate inside a process container; a depressurization mechanism configured to perform a pressure-decreasing process of depressurizing an interior of the process container to have a pressure of 1 Pa or lower; a light irradiation mechanism configured to irradiate the substrate with a vacuum ultraviolet light after the interior of the process container is depressurized so that an internal pressure of the process container reaches a pressure of 1 Pa or lower; and a controller configured to output a control signal such that an average depressurization rate inside the process container performed by the depressurization mechanism becomes 250 Pa/sec or lower while the interior of the process container is depressurized from 10,000 Pa to 1 Pa.

According to another embodiment of the present disclosure, there is provided a substrate processing method, including: mounting a substrate with a pattern mask formed on the substrate inside a process container; depressurizing an interior of the process container; irradiating the substrate with a vacuum ultraviolet light after the interior of the process container is depressurized to have a pressure of 1 Pa or lower in the depressurizing; and controlling an average depressurization rate inside the process container performed in the depressurizing to become 250 Pa/sec or lower while the interior of the process container is depressurized from 10,000 Pa to 1 Pa.

According to another embodiment of the present disclosure, there is provided a non-transitory computer-readable storage medium storing a computer program used in a substrate processing apparatus for improving a roughness of a pattern mask formed on a surface of a substrate, wherein the computer program includes a group of steps organized to execute the aforementioned substrate processing method.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
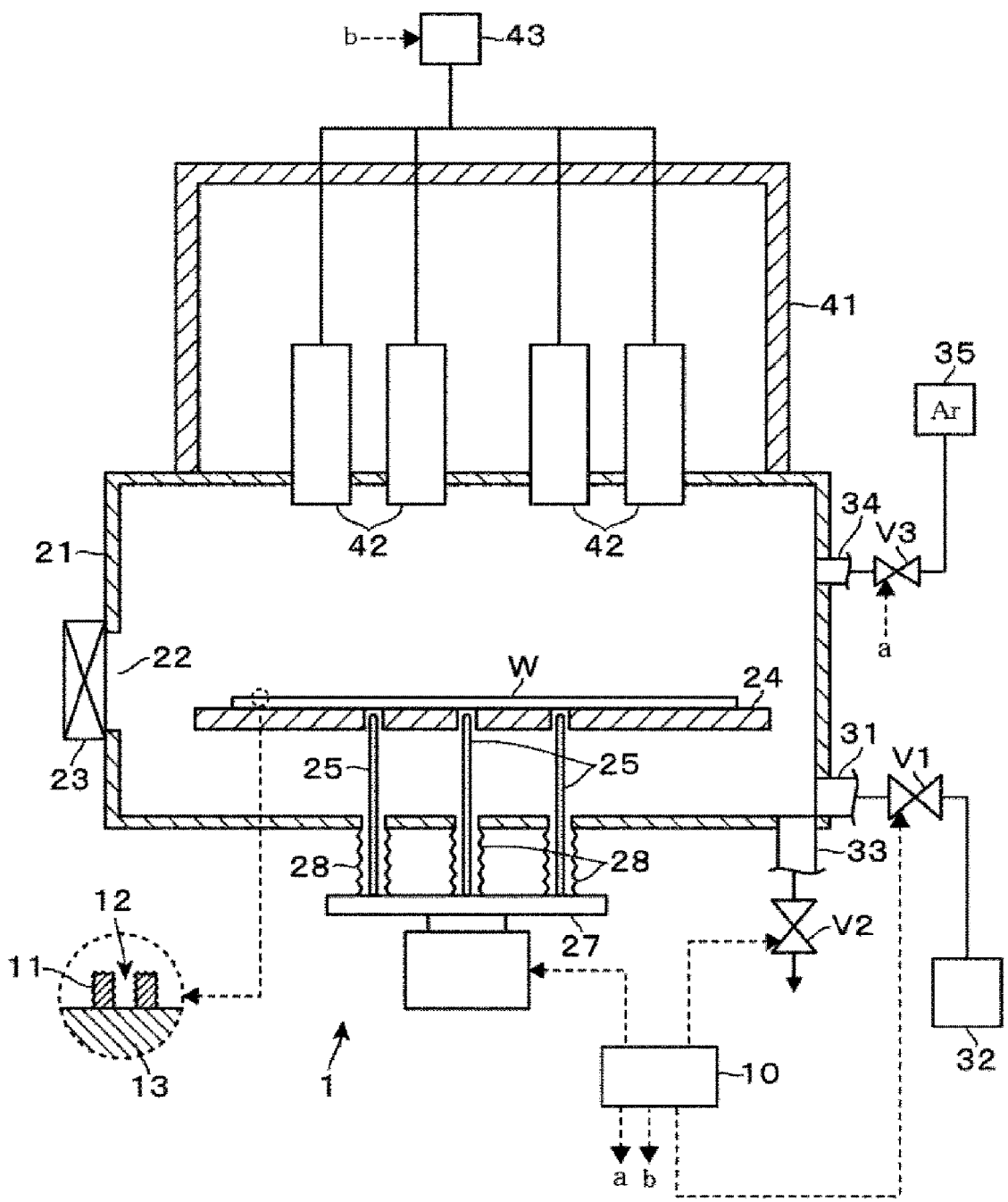
FIG. 1 is a longitudinal sectional view of a substrate processing apparatus according to the present disclosure.

A substrate processing apparatus 1 according to an embodiment of the present disclosure will be described with reference to a longitudinal sectional view of FIG. 1. The substrate processing apparatus 1 includes a process container (vacuum container) 21 installed in, for example, an atmospheric atmosphere, and receives a wafer W, which is a circular substrate, transferred by a transfer mechanism (not shown) in the process container 21 so as to perform a process. A longitudinal section of the surface of the wafer W is illustrated in an enlarged scale at the end of dotted arrow in FIG. 1. As illustrated in FIG. 1, a resist film 11 is formed on the surface of the wafer W. The resist film 11 is developed after exposure to form a resist pattern 12. The substrate processing apparatus 1 improves the roughness of the surface of the resist pattern 12 by irradiating the wafer W with light. The resist pattern 12 is a mask pattern for forming a pattern on an antireflection film 13 by etching the antireflection film 13 under the resist film 11.

In FIG. 1, reference numeral 22 denotes a transfer port through which the wafer W is loaded into and unloaded from the process container 21. The transfer port 22 is opened in a sidewall of the process container 21. In FIG. 1, reference numeral 23 denotes a gate valve that opens and closes the transfer port 22. A circular mounting table 24 is installed inside the process container 21. The wafer W is mounted on the mounting table 24 in a horizontal posture such that the center of the wafer W overlaps the center of the mounting table 24. Three vertical elevating pins 25 are installed in the mounting table 24. Lower ends of the elevating pins 25, which penetrate a bottom portion of the process container 21, are connected to an elevating mechanism 27 installed outside the process container 21. Upper ends of the elevating pins 25 are moved upward and downward on the upper surface of the mounting table 24 by the elevating mechanism 27 such that the wafer W is delivered between the transfer mechanism that enters the process container 21 via the transfer port 22 and the mounting table 24. In FIG. 1, reference numeral 28 denotes a vertically extendible bellows which surrounds a lower end portion of each of the elevating pins 25. The bellows 28 connects the bottom portion of the process container 21 and the elevating mechanism 27 so that the interior of the process container 21 is hermetically sealed.

One end of an exhaust pipe 31 is connected to the process container 21 and the other end of the exhaust pipe 31 is connected to a vacuum pump 32 via a valve V1. The interior of the process container 21 is exhausted by the vacuum pump 32 through the exhaust pipe 31 so that the interior of the process container 21 becomes a vacuum atmosphere. An opening degree of the valve V1 is adjusted based on a control signal provided from a control part 10 as described hereinbelow, such that the exhaust amount of the vacuum pump 32 is adjusted. Thus, it is possible to control an internal depressurization level of the process container 21 per unit time to have a desired value. A combination of the valve V1 and the vacuum pump 32 constitutes a depressurization mechanism.

In addition, one end of a pipe 33 is connected to the process container 21, and the other end of the pipe 33 is opened to an atmospheric environment via a valve V2. The pipe 33 and the valve V2 are installed to return the interior of the process container 21, which is kept in the vacuum atmosphere, to the atmospheric environment. In addition, one end of a pipe 34 is connected to the process container 21, and the other end of the pipe 34 is connected to a supply source 35 of an argon (Ar) gas which is an inert gas of the resist via a valve V3. The supply and cutoff of the Ar gas from the Ar gas supply source 35 to the process container 21 are performed by opening and closing the valve V3. Furthermore, the Ar gas supply source 35 is configured to adjust a flow rate of the Ar gas supplied to the pipe 34. The role of the Ar gas will be described hereinbelow. A combination of the valve V3 and the Ar gas supply source 35 constitutes a pressure-increasing gas supply mechanism.

Figure 2:
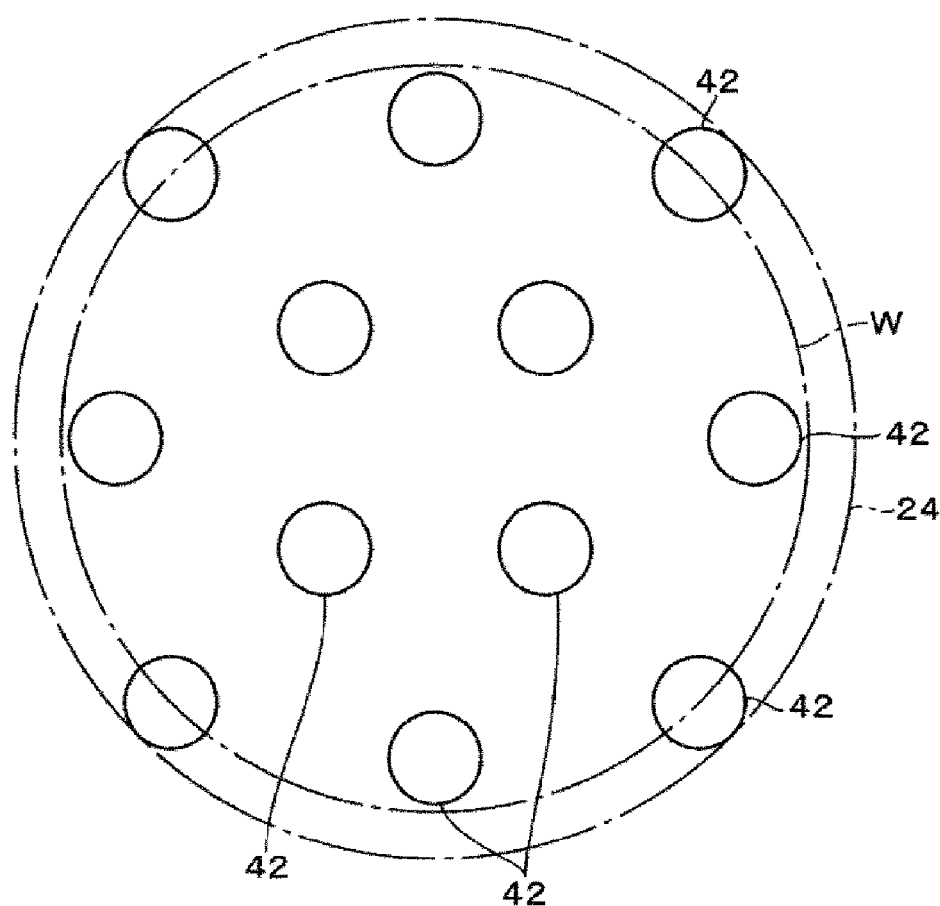
FIG. 2 is a plan view of a deuterium lamp installed in the substrate processing apparatus.

A housing 41 is installed on the process container 21. For example, 12 deuterium lamps 42 are installed inside the housing 41. FIG. 2 is a plan view illustrating an example of an arrangement of the deuterium lamps 42. The deuterium lamps 42 are arranged along two concentric circles which have a center coinciding with the center of the mounting table 24 when viewed in a plane. Four deuterium lamps 42 are arranged along the inner circle and eight deuterium lamps 42 are arranged along the outer circle. These deuterium lamps 42 are arranged in a mutually spaced-apart relationship along a circumferential direction. With the deuterium lamps 42 arranged in this manner, the entire surface of the wafer W mounted on the mounting table 24 is irradiated with light. In FIG. 1, reference numeral 43 denotes a switch for switching an ON/OFF operation of the deuterium lamps 42. The operation of the switch 43 is controlled by the control part 10. A combination of the switch 43 and the deuterium lamps 42 constitutes a light irradiation mechanism.

Figure 3:
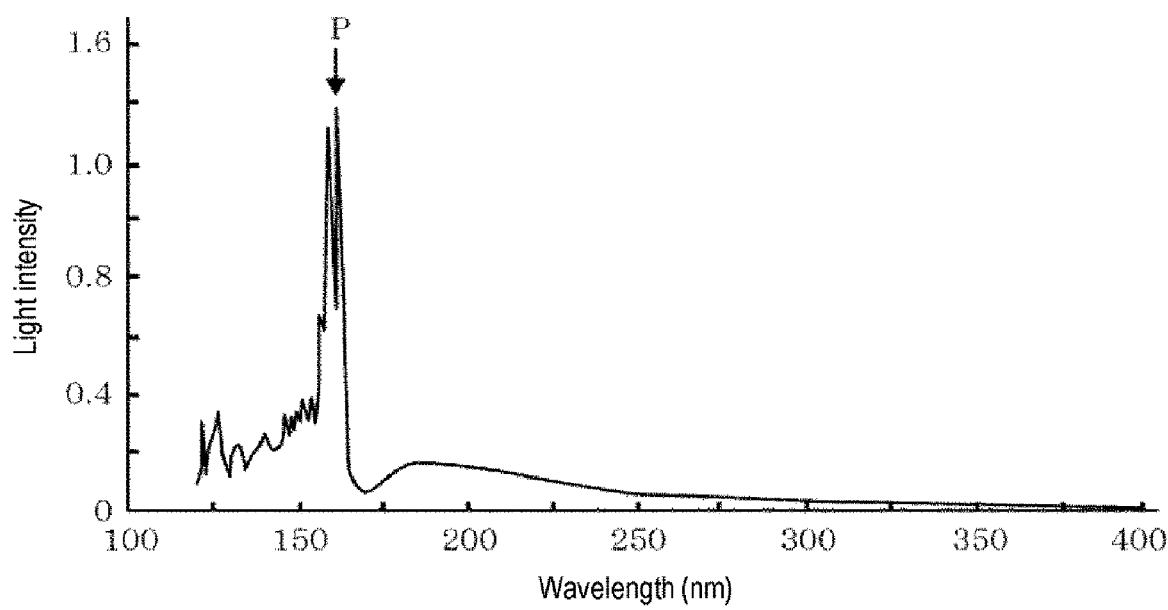
FIG. 3 is a waveform diagram of the spectrum of light irradiated from the deuterium lamp.

FIG. 3 illustrates an example of the spectrum of light irradiated from the deuterium lamp 42. As illustrated in FIG. 3, the deuterium lamp 42 irradiates light having a wavelength of, for example, 115 to 400 nm, namely light having a continuous spectrum of 115 to 400 nm. Therefore, the light irradiated from the deuterium lamp 42 includes vacuum ultraviolet light (VUV light), namely light having a wavelength of 10 to 200 nm. In addition to the vacuum ultraviolet light (vacuum ultraviolet rays), the light irradiated from the deuterium lamp 42 also includes near ultraviolet light (near ultraviolet rays) having a wavelength greater than 200 nm. Furthermore, the wavelength of a peak of the continuous spectrum of the light irradiated from the deuterium lamp 42 is, for example, 160 nm or less and 150 nm or more. In FIG. 3, an arrow P indicates the wavelength of the peak.

As described above, since the wavelength range of the spectrum of the light irradiated from the deuterium lamp 42 is relatively wide, the resist pattern 12 receives light energies of various wavelengths. As a result, various reactions may occur on the surface of the resist pattern 12. More specifically, since chemical bonds at different positions of molecules constituting the resist film 11 are broken to produce various compounds, the orientation of the molecules existing in the resist film 11 before the light irradiation is eliminated and a surface free energy of the resist film 11 decreases to reduce an internal stress, as also described in evaluation tests described hereinbelow. In other words, by using the deuterium lamp 42 as the light source, the fluidity of the surface of the resist pattern 12 is likely to be high. As a result, the effect of improving the roughness of the surface can be enhanced.

For the light irradiated onto the resist film 11, the greater the wavelength, the higher the intensity of the light. Such a light reaches a deep layer of the resist film 11. However, since the wavelength of the peak of the spectrum of the light irradiated from the deuterium lamp 42 falls within the band (10 to 200 nm) of the VUV light as described above, the light irradiated from the deuterium lamp 42 has a relatively small intensity at a relatively large wavelength. For this reason, a small amount of light irradiated from the deuterium lamp 42 reaches the deep layer of the resist film 11. This makes it possible to suppress the bonds of molecules from being broken in the deep layer of the resist film 11. That is to say, by using the deuterium lamp 42, it is possible to limit a region that reacts in the resist pattern 12 by light irradiation to the surface.

In addition, in an atmosphere where oxygen exists, the VUV light reacts with the oxygen. This deteriorates the effect of improving the roughness of the resist pattern 12. Therefore, as will be described later, when processing the wafer W, a vacuum atmosphere is formed inside the process container 21 in order to remove oxygen existing in the process container 21. Here, as described above, the molecules having a relatively small molecular weight, formed as the bonds are broken by the light irradiation, are likely to be released to the vacuum atmosphere as a gas. However, as described above, since such breaking of bonds is unlikely to occur in the deep layer of the resist film, the release of gas from the deep layer is suppressed. Thus, it is possible to suppress occurrence of a change in the overall shape of the resist pattern 12, such as a change in height or width.

As illustrated in FIG. 1, the substrate processing apparatus 1 includes the control part 10 configured as a computer. A program is stored in the control part 10. This program includes a group of steps organized to cause control signals to transmit to respective parts of the substrate processing apparatus 1 to control the operation of each part so as to execute processes as described hereinbelow. Specifically, the adjustment of the opening degree of the valve V1, and the opening/closing operation of the valves V2 and V3, the adjustment of the flow rate of the Ar gas supplied from the Ar gas supply source 35, the supply and cutoff of light with respect to the wafer W performed by the switching operation of the switch 33, the vertical movement of the elevating pins 25 by the elevating mechanism 27, the opening/closing operation of the gate valve 23, and the like are controlled by the control signals. This program is stored in a storage medium such as a hard disk, a compact disc, a DVD, or a memory card, and installed on the control part 10.

Figure 4:
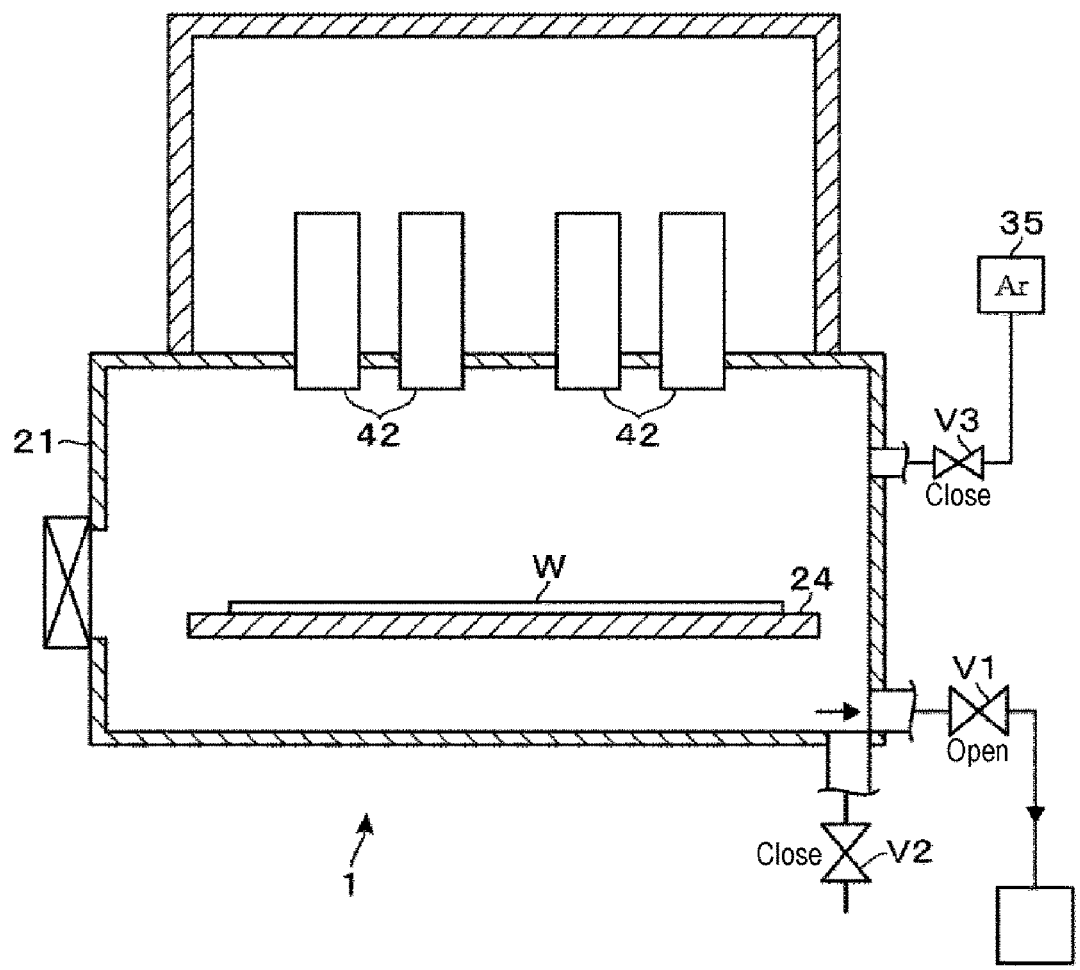
FIG. 4 is an explanatory diagram illustrating an operation of the substrate processing apparatus.
Figure 5:
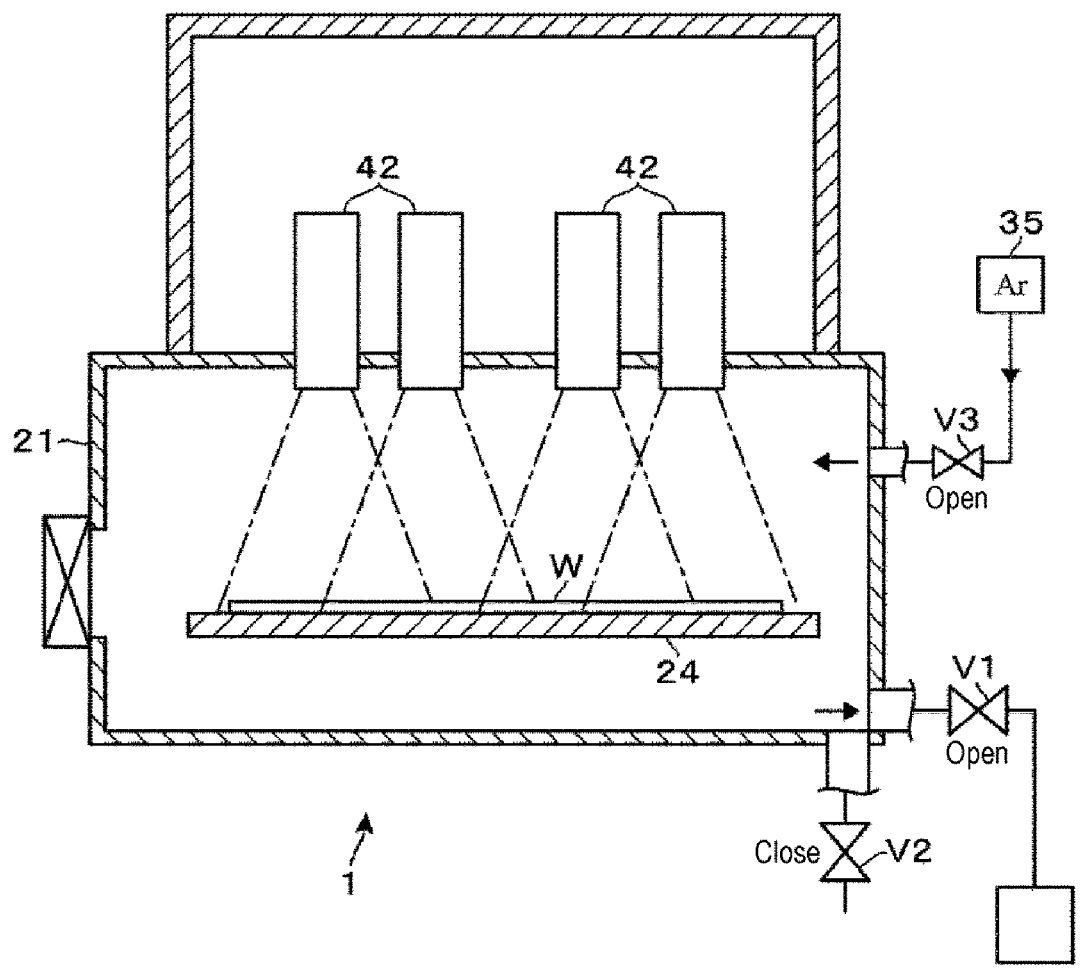
FIG. 5 is an explanatory diagram illustrating an operation of the substrate processing apparatus.
Figure 6:
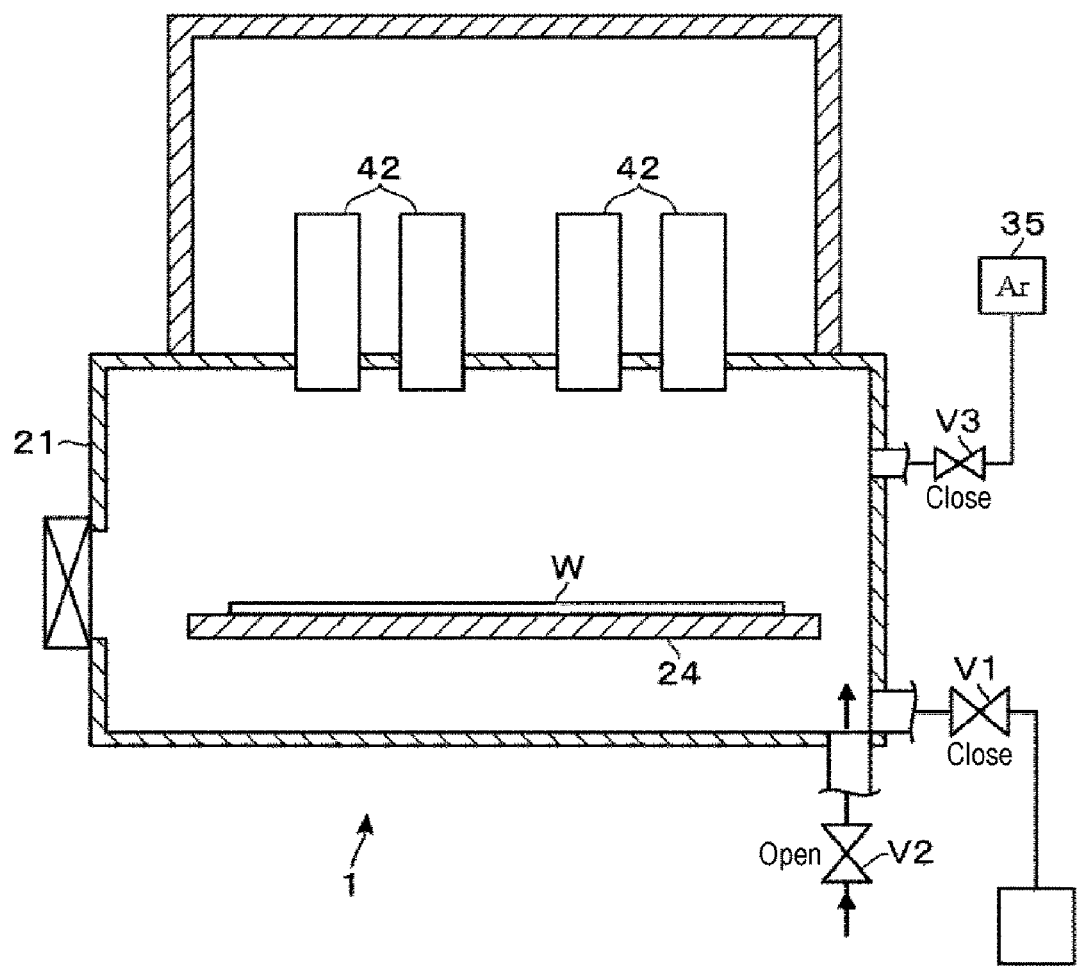
FIG. 6 is an explanatory diagram illustrating an operation of the substrate processing apparatus.

Next, an operation of the substrate processing apparatus 1 will be described with reference to FIGS. 4 to 6. An outline of a time-dependent change in an internal pressure of the process container 21 will be described with reference to a graph of FIG. 7. In a single logarithmic graph of FIG. 7, the horizontal axis indicates an elapsed time during the process, and the vertical axis with a logarithmic scale indicates an internal pressure (unit: Pa) of the process container 21. First, a wafer W is carried into the process container 21 by the transfer mechanism with the valves V1 to V3 closed. If the wafer W is mounted on the mounting table 24, the gate valve 23 is closed and the interior of the process container 21 is hermetically sealed. At this time, the interior of the process container 21 is, for example, in an atmospheric environment of standard atmospheric pressure. Thereafter, the valve V1 is opened at a predetermined degree of opening (time t1) so that the internal pressure of the process container 21 decreases (FIG. 4). Then, the internal pressure of the process container 21 becomes 10,000 Pa (time t2).

If the internal pressure of the process container 21 reaches 1 Pa (time t3) as the pressure further decreases, the valve V3 is opened to supply an Ar gas into the process container 21. Then, the interior of the process container 21 becomes an Ar gas atmosphere and the internal pressure of the process container 21 increases. The opening degree of the valve V1 is controlled such that the average of the depressurization rate from time t2 to time t3 becomes 250 Pa/sec or lower. That is to say, [(10,000 Pa-1 Pa)/time period (unit:seconds) from time t2 to time t3] is 250 Pa/sec or lower. Also, in the graph of FIG. 7, the depressurization rate is indicated to be constant from time t2 to time t3 for the sake of convenience in description, but it is only necessary to obtain the average depressurization rate as described above. For example, the depressurization rate may be varied as in an example described in evaluation test 8 which will be described later.

Then, when the internal pressure of the process container 21 reaches, for example, 100 Pa, by the Ar gas supplied at time t3, the internal pressure of the process container 21 is maintained at 100 Pa in-situ. Light including the VUV light is irradiated from the deuterium lamps 42 onto the wafer W (as indicated by chain lines in FIG. 5) (time t4). If the light is irradiated from the deuterium lamps 42 for a predetermined period of time, for example, 30 seconds, the light irradiation is stopped (time t5). The valves V1 and V3 are closed to stop the supply of the Ar gas into the process container 21 and the exhaust of the gas from the process container 21. Subsequently, the valve V2 is opened to allow the atmosphere to flow into the process container 21 and to return the interior of the process container 21 to an atmospheric environment of standard pressure (FIG. 6). The valve V2 is closed and the wafer W is unloaded from the interior of the process container 21.

From the results of each evaluation test as described hereinbelow, it is considered that the resist pattern 12 is in a state illustrated in schematic diagrams of FIGS. 8 to 12 during the process of the wafer W described above. Before describing each figure, the resist film 11 in which the resist pattern 12 is formed will be further described. For example, a resin such as polymethylmethacrylate (PMMA), an acid-generating agent, a solvent, a decomposed material, or the like is included in the resist film 11 carried into the substrate processing apparatus 1. The decomposed material refers to a compound generated by decomposing components contained in the resist film 11 by a pre-development exposure for forming the resist pattern 12. The polymer resin and the acid-generating agent as described above are molecules having a relatively large molecular weight and are indicated as molecules 14. Furthermore, the solvent and the decomposed material are molecules having a relatively small molecular weight. The solvent is indicated as molecules 15 and the decomposed material is indicated as molecules 16.

Figure 8:
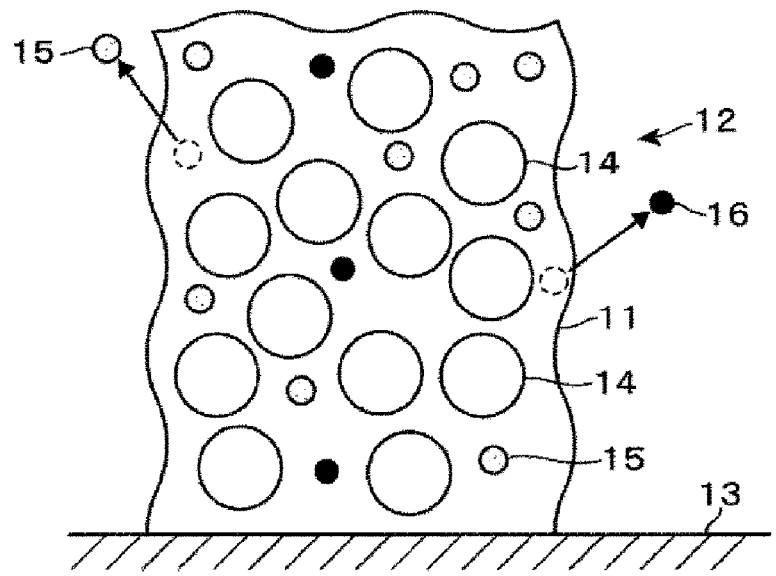
FIG. 8 is an explanatory diagram illustrating a state of a resist pattern.

After time t1, the interior of the process container 21 is depressurized so that the molecules 15 and 16 having a relatively small molecular weight are desorbed from the resist pattern 12 as a gas. Then, after time t2 at which the internal pressure becomes 10,000 Pa or lower, the internal pressure of the process container 21 further decreases, so that the molecules 15 and 16 in the process container 21 are more likely to be desorbed as a gas and the molecules 14 having a relatively large molecular weight are in an environment in which they are also likely to be desorbed as a gas. However, since a rapid change in pressure is suppressed by controlling the depressurization rate in the process container 21 as described above after time t2, it is possible to suppress the application of strong stress to the resist pattern 12, and also to suppress desorption of these molecules 14 to 16 (FIG. 8).

The state of the surface layer of the resist pattern 12 when the interior of the process container 21 is depressurized in this manner will be described in more detail. The periphery of the resist pattern 12 is in a relatively low vacuum atmosphere, the molecules 15 and 16 having a relatively small molecular weight are desorbed from the surface layer of the resist pattern 12. However, the amount of desorption is suppressed to be relatively small by controlling the depressurization rate as described above. By allowing the molecules 15 and 16 to be appropriately desorbed in this way, the molecules are prevented from being densely present in the surface layer of the resist pattern 12, and thus, each molecule remaining on the surface layer of the resist pattern 12 has moderate fluidity. That is to say, when receiving energy generated by the subsequent light irradiation, each molecule on the surface layer of the resist pattern 12 easily moves, and the roughness can be improved. In addition, if the molecules 14 having a relatively large molecular weight are desorbed, the state of the surface layer of the resist pattern 12 greatly changes due to the size of those molecules. This increases the degree of roughness. However, since the depressurization rate is controlled as described above, the desorption of the molecules 14 is suppressed. Therefore, the roughness of the surface layer of the resist pattern 12 is suppressed from increasing by the desorption of the molecules 14.

Figure 9:
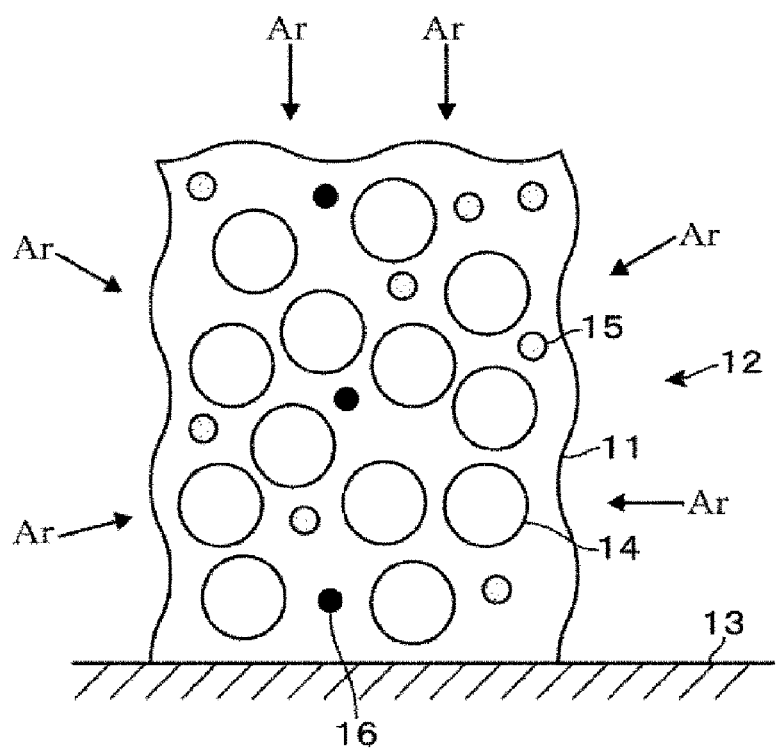
FIG. 9 is an explanatory diagram illustrating a state of a resist pattern.

Then, as the depressurization of the interior of the process container 21 proceeds, the concentration of oxygen inside the process container 21 decreases. When the interior of the process container 21 reaches 1 Pa at time t3, the oxygen concentration reaches a concentration at which the VUV light-based process is hardly affected, specifically, for example, reaches 2 ppm or less. Further, the Ar gas is supplied into the process container 21 so that the internal pressure of the process container 21 is increased, which establishes an environment in which the desorption of the molecules 14 to 16 from the resist pattern 12 is more reliably suppressed (FIG. 9). Since the desorption of the molecules 14 having a relatively large molecular weight is suppressed before time t4 at which the light irradiation by the deuterium lamp 42 is performed in this manner, an overall shape of the resist pattern 12 at time t4 is suppressed from being changed from the overall shape of the resist pattern 12 before the process by the substrate processing apparatus 1 starts.

Figure 10:
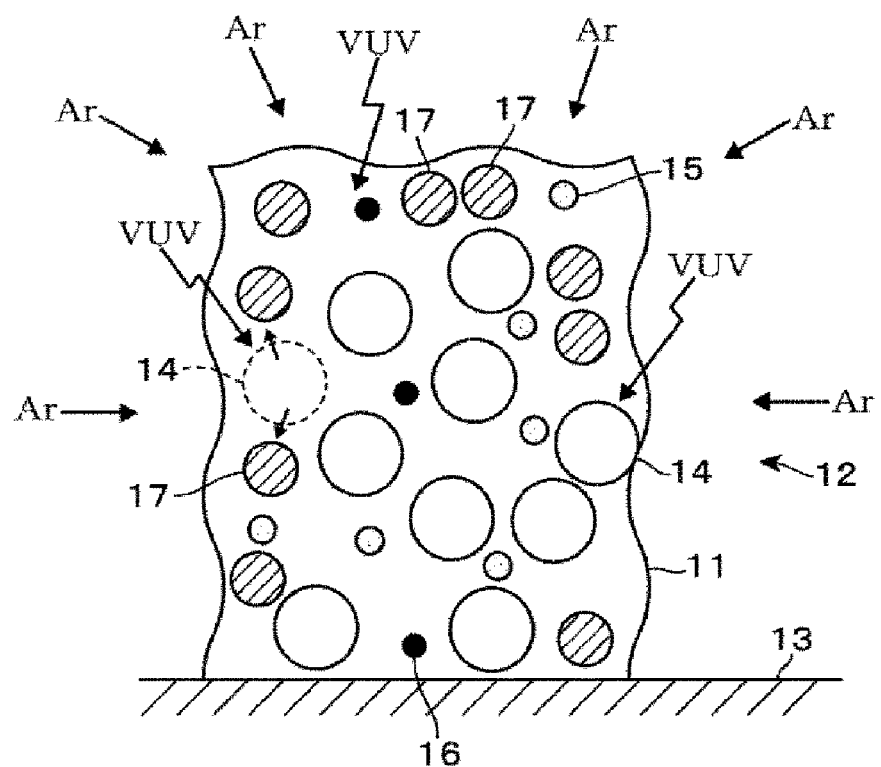
FIG. 10 is an explanatory diagram illustrating a state of a resist pattern.

In addition, by the light irradiation performed by the deuterium lamp 42 as described above, the bonds of the molecules 14 on the surface of the resist pattern 12 are broken by light energy to generate molecules 17 (FIG. 10). As described above, since the bonds of the molecules 14 used as polymers at various positions are broken, various kinds of molecules 17 are generated. In addition, as described above, since the bonds of the molecules 14 are broken, the surface free energy of the resist pattern 12 is decreased so that an internal stress of the surface of the resist pattern 12 is reduced. It is considered that, even if the molecules 16 as resist decomposed materials are somewhat desorbed in an interval from time t1 to time t3, such desorption contributes to the reduction of the internal stress.

Since the increase in pressure by the supply of the Ar gas is performed as described above before the light irradiation is performed, each of the molecules 14 to 16 and the newly generated molecules 17 are suppressed from being released into the process container 21 as a gas during the light irradiation. Accordingly, the change in the abstract shape of the resist pattern 12 due to the light irradiation is suppressed by the increase in pressure using the Ar gas.

Figure 11:
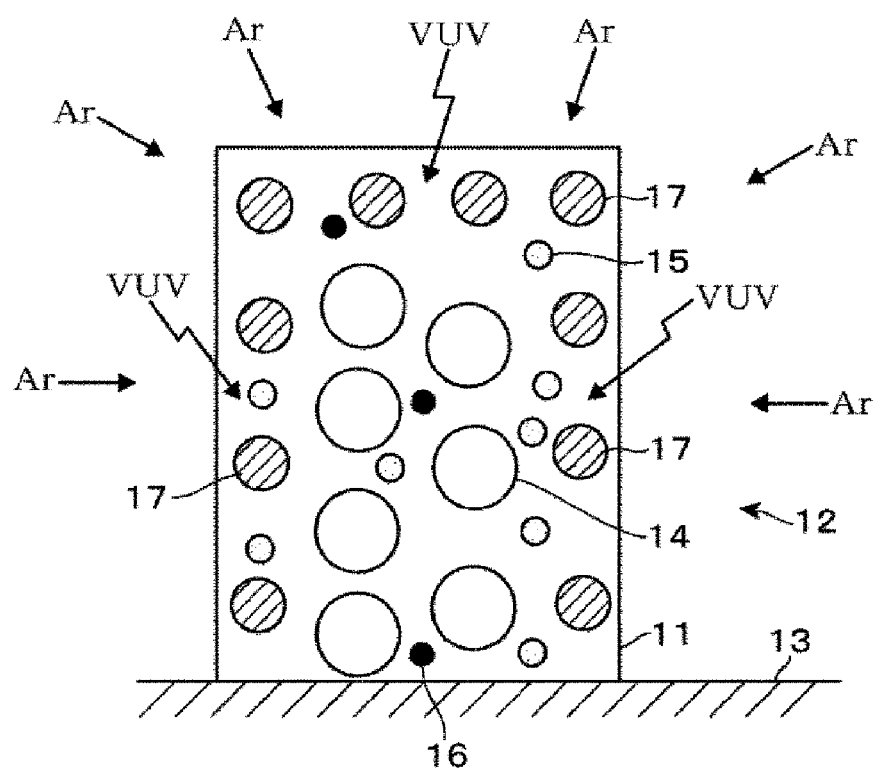
FIG. 11 is an explanatory diagram illustrating a state of a resist pattern.

However, as described above, since the desorption of the molecules 15 as solvents from the surface of the resist pattern 12 is suppressed by relatively slowing the depressurization rate in an interval from time t2 to time t3 and increasing the internal pressure by the Ar gas, excessive drying of the surface of the resist pattern 12 is prevented during the light irradiation. In addition, the molecules 16 which have a relatively small molecular weight and are relatively easy to move properly remain. Therefore, the surface of the resist pattern 12 has a relatively high fluidity. Thus, each of the molecules 14 to 17 can easily move on the surface of the resist pattern 12 by the reduction of the internal stress as described above. Accordingly, the roughness of the surface of the resist pattern 12 is improved. That is to say, the unevenness of the surface is smoothed (FIG. 11).

Figure 12:
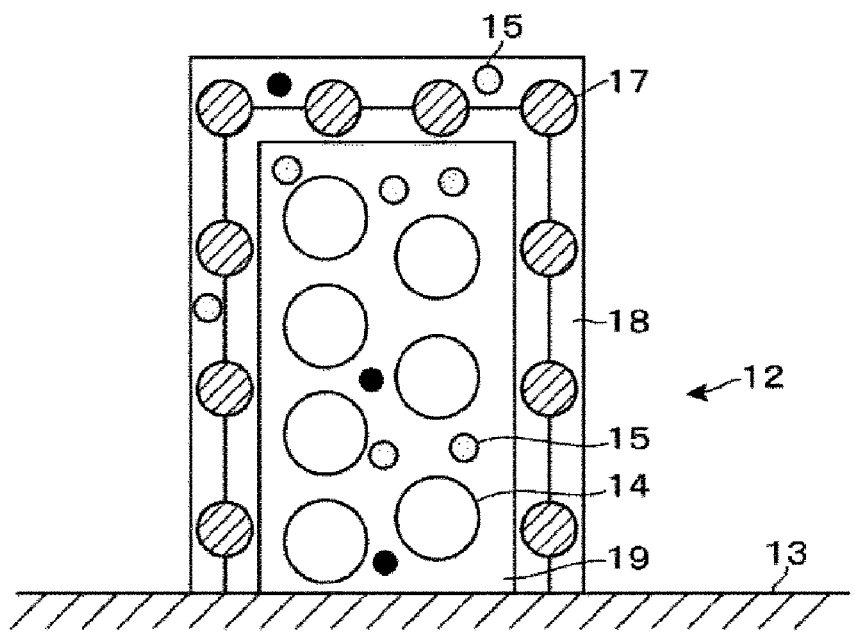
FIG. 12 is an explanatory diagram illustrating a state of a resist pattern.

Furthermore, the molecules 17 remaining in the resist pattern 12 during the light irradiation and immediately after the completion of the light irradiation are bonded to each other and are crosslinked. Thus, the surface layer portion of the resist pattern 12 becomes a hardened layer 18 which is harder than before the light irradiation (FIG. 12). For the sake of convenience in description, a region covered with the hardened layer 18 in the resist pattern 12 is defined as a body portion 19. Meanwhile, after the wafer W is unloaded from the substrate processing apparatus 1, the wafer W is carried into a process container constituting an etching apparatus. Then, an etching gas is supplied into the process container in a state in which the interior of the process container is in a vacuum atmosphere. The antireflection film 13 is etched using the resist pattern 12 as a mask to form a pattern (unevenness) in the antireflection film 13. When the vacuum atmosphere is formed during the etching process in this manner, each of the molecules 14 to 16 constituting the body portion 19 is suppressed from being desorbed as a gas into the vacuum atmosphere by being covered with the hardened layer 18. It is therefore possible to prevent the shape of the resist pattern 12 from being changed. Thus, it is possible to prevent the pattern formed by etching the antireflection film 13 from being different from a pattern of a desired shape.

According to the substrate processing apparatus 1 configured as above, the average depressurization rate in the process container 21 becomes 250 Pa/sec or lower in a time interval from when the internal pressure of the process container 21 is reduced to 10,000 Pa until the internal pressure reaches 1 Pa. Therefore, the pressure is suppressed from being rapidly changed in a state in which the wafer W is exposed to an atmosphere having a relatively high degree of vacuum. It is therefore possible to prevent the molecules constituting the resist pattern 12 from being desorbed as a gas until the light irradiation by the deuterium lamps 42 is performed. Accordingly, it is possible to suppress the abstract shape of the resist pattern 12 from being changed and also to improve the roughness of the surface of the resist pattern 12.

In addition, according to the substrate processing apparatus 1, when the internal pressure of the process container 21 reaches 1 Pa, the internal pressure of the process container 21 is increased by the Ar gas. By increasing the internal pressure in this way, it is possible to prevent a period of time during which the wafer W is exposed to an atmosphere having a relatively high degree of vacuum until the light irradiation is performed, from being prolonged. Thus, it is possible to more reliably suppress the molecules constituting the resist pattern 12 from being desorbed. Moreover, by increasing the internal pressure, the molecules 17 generated by the light irradiation are suppressed from being desorbed from the resist. This suppresses a change in the abstract shape of the resist pattern 12 in a more reliable manner. Furthermore, the supply of the Ar gas is not performed until the internal pressure of the process container 21 reaches 1 Pa. Therefore, the exhaust efficiency of oxygen from the process container 21 is increased, and the concentration of oxygen can quickly reach a concentration at which the deuterium lamps 42 can process.

Figure 7:
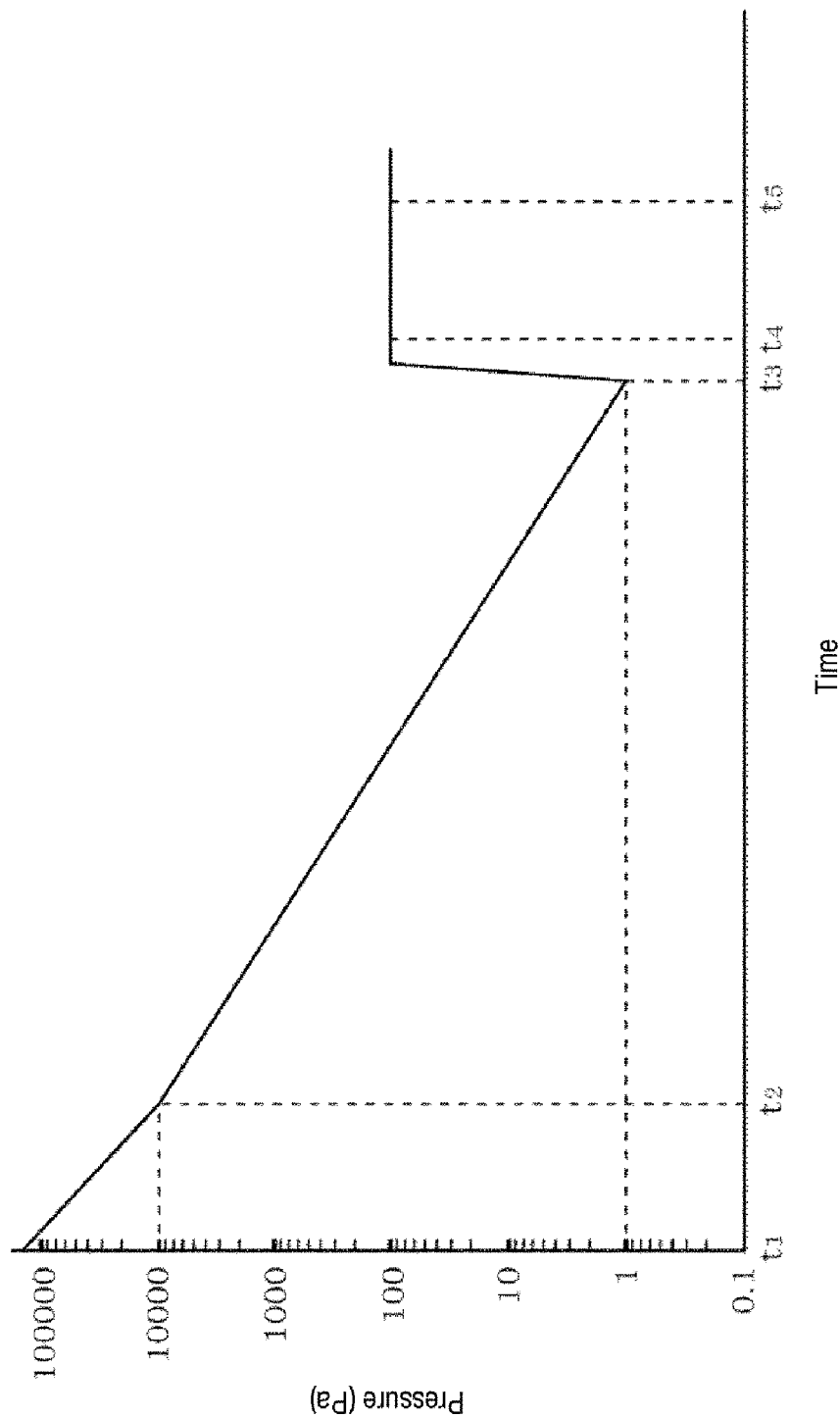
FIG. 7 is a graph showing a change in internal pressure of a process container of the substrate processing apparatus.

In the graph of FIG. 7, the depressurization rate in the time interval between time t1 and time t2 has been illustrated to be higher than the depressurization rate in the time interval between time t2 and time t3, but the depressurization rate in the time interval between time t1 and time t2 may be lower than the depressurization rate in the time interval between time t2 and time t3. However, from the viewpoint of improving the throughput, the depressurization rate in the time interval between time t1 and time t2 may be equal to or higher than the depressurization rate in the time interval between time t2 and time t3. Furthermore, from the viewpoint of improving the throughput, a time interval between time t2 and time t3 during which the average depressurization rate is 250 Pa/sec or lower may be set to 60 seconds or lower.

In addition, in the aforementioned process, the Ar gas is used as a pressure-increasing gas for increasing the internal pressure of the process container 21, but other gas such as a nitrogen ($N_2$) gas may be used. However, in order that no trouble occurs in the process by reacting with the resist pattern 12 activated by the light irradiation and the gas released from the resist pattern 12, or by being activated by light radiated from the deuterium lamp 42, a gas which is extremely low in activity may be used as the pressure-increasing gas. For such reasons, the Ar gas rather than the $N_2$ gas may be employed. It has been confirmed that it is effective to use the Ar gas from the evaluation tests which will be described later. The desorption of molecules from the resist pattern 12 has been described to be prevented by performing the increase in pressure with the pressure-increasing gas but is not limited thereto. For example, the desorption of molecules may be suppressed by starting the light irradiation from the deuterium lamps 42 promptly, for example, within 10 seconds, from time t3 at which the internal pressure of the process container 21 reaches 1 Pa.

Figure 13:
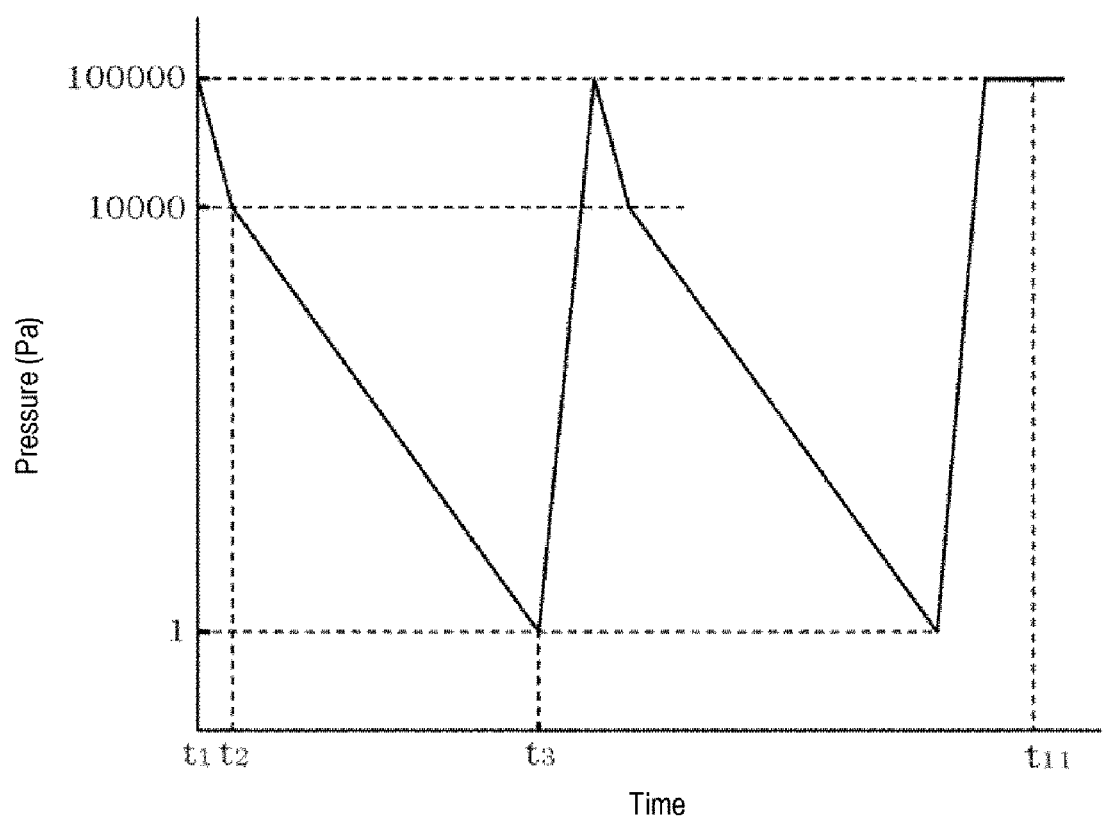
FIG. 13 is a graph showing a change in another internal pressure of in the process container.

FIG. 13 is a graph illustrating a change in internal pressure of the process container 21 when a process different from the process illustrated in FIG. 7 is performed. In the graph of FIG. 13, similar to the graph of FIG. 7, the pressure and time are indicated on the vertical axis and the horizontal axis, respectively. From time t1 to time t3, the interior of the process container 21 is depressurized in the same manner as the process described with reference to the graph of FIG. 7, and the internal pressure of the process container 21 is increased up to, for example, 100,000 Pa, by the Ar gas which starts to be supplied at time t3. Thereafter, the supply of the Ar gas is stopped, and the interior of the process container 21 is depressurized as in the process performed at times t1 to t3. That is to say, after the interior of the process container 21 reaches 10,000 Pa, the internal pressure is decreased at the average depressurization rate of 250 Pa/sec or lower.

Then, after the internal pressure reaches 1 Pa again, the internal pressure is increased again to reach 100,000 Pa by the Ar gas and the light irradiation is performed (time t11). That is to say, the pressure decrease and the pressure increase are repeatedly performed twice until the light irradiation is performed. The concentration of oxygen inside the process container 21 can be more reliably decreased by further performing an additional pressure decrease after the pressure decrease and the pressure increase in this manner. It is therefore possible to reliably supply light energy to the resist pattern 12, thus improving the roughness of the surface of the resist pattern 12 in a more reliable manner. Furthermore, by performing the additional pressure decrease as described above and subsequently performing an additional pressure increase followed by the light irradiation, a change in the overall shape of the resist pattern is suppressed as in the process of FIG. 7. In some embodiments, after the additional pressure decrease, the light irradiation may be performed without the additional pressure increase. The number of repetitions of the pressure decrease and the pressure increase is not limited to twice, and may be three times or more. However, in the process illustrated in the graph of FIG. 13, the light irradiation is performed after increasing the internal pressure until reaching approximately a normal pressure. In other words, the interior of the process container 21 is not limited to being in a vacuum atmosphere during the light irradiation, and may be in a normal pressure or a pressurized atmosphere.

Furthermore, if a distance between the deuterium lamp 42 and the wafer W is changed, the amount of light energy supplied to the resist pattern 12 is also changed. This affects the degree of improvement in roughness. Therefore, in the substrate processing apparatus 1 configured as above, an elevating mechanism for moving the mounting table 24 up and down may be installed to adjust the height of the mounting table 24 for each wafer W, and the supply amount of light energy may be adjusted depending on the roughness of the resist pattern 12 of each wafer W. In addition, in each of the aforementioned processes, the lower limit of the internal pressure of the process container 21 is 1 Pa, but may be a pressure lower than 1 Pa. Even in that case, the average depressurization rate described above may be applied while the internal pressure of the process container 21 is depressurized from 10,000 Pa to 1 Pa.

Furthermore, the substrate processing apparatus 1 may be applied to a case of processing a substrate such as a liquid crystal display (LCD) substrate in addition to the wafer W. In addition, the present disclosure is not limited to applying to the case of improving the roughness of the resist pattern and may be applied to a case of improving the roughness of a mask pattern formed on an antireflection film, a film containing carbon as a main component or the like, other than the resist film. Furthermore, the apparatus configuration and the processing method described herein may be properly modified or combined.

(Evaluation Tests)

Next, evaluation tests conducted in relation with the present disclosure will be described.

(Evaluation Test 1)

A test was conducted by storing a substrate with a resist pattern formed thereon in a process container of a test apparatus, followed by depressurizing the interior of the process container, followed by applying light with the deuterium lamp 42 when the interior of the process container reaches a set pressure. Set pressures were set to be different from each other in respective tests. For example, the set pressure was set to a pressure lower than 1 Pa, a pressure of 2 to 2.5 Pa, or a pressure higher than 2.5 Pa. Tests conducted at the pressure lower than 1 Pa, the pressure of 2 to 2.5 Pa, and the pressure higher than 2.5 Pa will be referred to as Evaluation test 1-1, Evaluation test 1-2 and Evaluation test 1-3, respectively. Further, Control test 1 was performed under the same conditions as those of Evaluation tests 1-1 to 1-3 except that light was irradiated while the interior of the process container is kept at a normal pressure (atmospheric pressure).

For the substrate of each test in which the light irradiation was performed as described above, a critical dimension (CD) which is a line width of the resist pattern, a line edge roughness (LER) and a line width roughness (LWR) were measured. The LWR and LER are indicators of the roughness of the resist pattern, in which the lower the value, the smaller the surface roughness of the pattern. In addition, ΔCD was calculated for Evaluation tests 1-1 to 1-3. ΔCD is (CD of Control test minus CD of Evaluation test)/(CD of Control test)×100(%). Further, for Evaluation tests 1-1 to 1-3, each of the improvement rates of LER and LWR was obtained. The improvement rate is (value of Control test minus value of Evaluation test)/(value of Control test)×100 (%).

Figure 14:
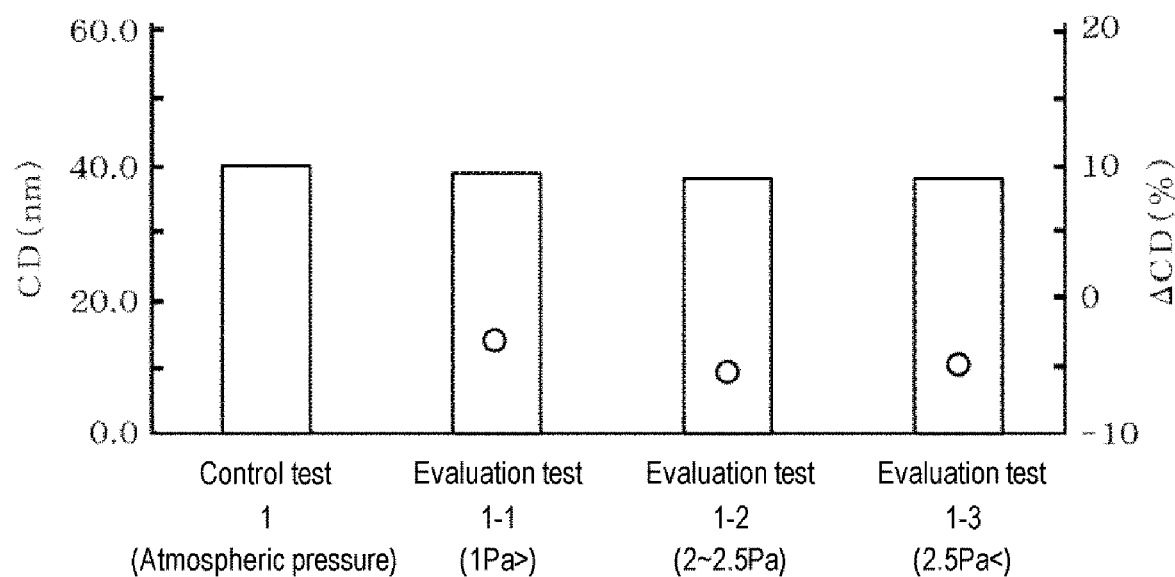
FIG. 14 is a graph showing results of an evaluation test.
Figure 15:
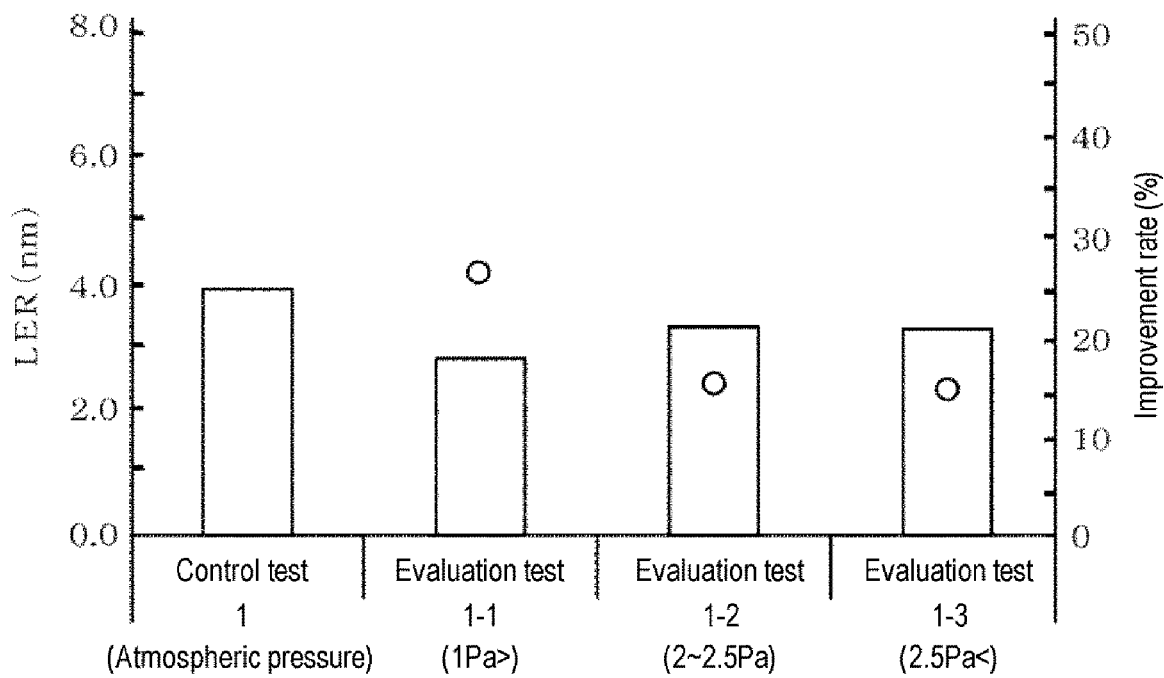
FIG. 15 is a graph showing results of an evaluation test.
Figure 16:
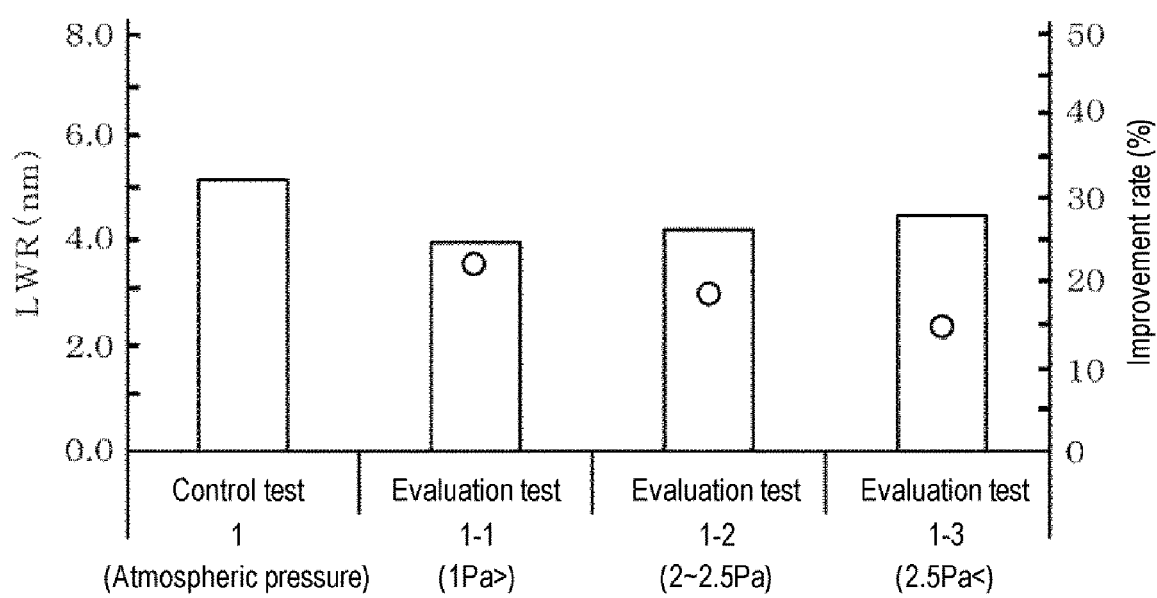
FIG. 16 is a graph showing results of an evaluation test.

FIGS. 14, 15, and 16 are graphs showing results of the aforementioned tests. Two vertical axes of the graph of FIG. 14 indicate CD and ΔCD, respectively. The unit for each vertical axis is nm. Further, in the graph, CD is indicated by a bar graph and ΔCD is indicated by dots. As shown in FIG. 14, there is no large difference in the value of CD between Evaluation tests 1-1 to 1-3 and Control test 1, and ΔCD is about −5%. Accordingly, it can be seen that CD is hardly affected by the light irradiation performed by the deuterium lamps 42.

Two vertical axes of a graph of FIG. 15 indicate LER and an improvement rate of LER, respectively. In this graph, LER is indicated by a bar graph and the improvement rate of LER is indicated by dots. Two vertical axes of a graph of FIG. 16 indicate LWR and an improvement rate of LWR, respectively. Also, in the graph, LWR is indicated by a bar graph and the improvement rate of LWR is indicated by dots. The unit for each vertical axis in FIG. 15 and FIG. 16 is nm. As shown in FIG. 15, values of LER are different from each other for each test. For the improvement rate of LER, Evaluation tests 1-2 and 1-3 were about 15%, whereas Evaluation test 1-1 exceeded 25%. As shown in FIG. 16, values of LWR are different from each other for each test. For the improvement rate of LWR, Evaluation tests 1-2 and 1-3 were less than 20%, whereas Evaluation test 1-1 exceeded 20%. Accordingly, from the results of Evaluation test 1, it can be seen that it is desirable to irradiate light by the deuterium lamps 42 at a pressure lower than 1 Pa in order to obtain sufficient improvement rates of LWR and LER.

(Evaluation Test 2)

Evaluation test 2 was conducted in which light was irradiated onto the resist pattern formed on the surface of the substrate using the deuterium lamps 42 in the same manner as in Evaluation test 1. However, set internal pressures of the process container during the light irradiation were 1 Pa, 1×10⁻² Pa or 1×10⁻⁴ Pa. Tests conducted at the set pressures of 1 Pa, 1×10⁻² Pa or 1×10⁻⁴ Pa are referred to as Evaluation test 2-1, Evaluation test 2-2, and Evaluation test 2-3, respectively. Further, Control test 2 was conducted under the same conditions as those in Evaluation tests 2-1 to 2-3 except that light was irradiated in a state where the interior of the process container is set to have a normal pressure (atmospheric pressure). For the resist pattern irradiated with light in each of the tests, CD, LWR, LER, and a film thickness of the resist were measured.

Table 1 given below shows results of Evaluation test 2. The unit of each numerical value in Table 1 is nm. As shown in Table 1, there is no large difference in CD for each test. LWR and LER values in Evaluation tests 2-1 to 2-3 were lower than those in Control test 2, and LWR and LER values in Evaluation tests 2-2 and 2-3 were higher than those in Evaluation test 2-1. The reason for this is as follows. In Evaluation tests 2-2 and 3-3, since the degree of vacuum is high, molecules having a relatively small molecular weight were excessively desorbed, which deteriorates the fluidity of the surface of the resist pattern. Thus, it is considered that the improvement effect was lower than that of Evaluation test 2-1. From the results of Evaluation test 2, it can be seen that it is desirable to depressurize the interior of the process container 21 at a pressure of $1 \times 10^{-2}$ Pa or lower in the aforementioned process. Further, from the results of Evaluation test 2 and the results of Evaluation test 1 described above, it was confirmed that the roughness of the pattern can be sufficiently improved by setting the internal pressure of the process container 21 to 1 Pa or lower until the light irradiation is performed.

TABLE 1

| Unit: nm | Control test 2 (Atmospheric pressure) | Evaluation test 2-1 (1 Pa) | Evaluation test 2-2 ($1 \times 10^{-2}$ Pa) | Evaluation test 2-3 ($1 \times 10^{-4}$ Pa) |
|---|---|---|---|---|
| CD | 38.74 | 39.84 | 38.12 | 36.34 |
| LWR | 4.47 | 3.56 | 3.8 | 3.79 |
| LER | 3.46 | 2.85 | 2.88 | 3.12 |
| Resist film thickness | 89 | 79 | 79 | 80 |

(Evaluation Test 3)

In Evaluation test 3-1, light was irradiated onto the resist pattern formed on the surface of the substrate for 30 seconds using the deuterium lamp 42 under a vacuum atmosphere. Further, in Evaluation test 3-2, light was irradiated in substantially the same manner as in Evaluation test 3-1, except that an Ar excimer lamp was used instead of the deuterium lamp 42. Further, in Evaluation test 3-3, light was irradiated in substantially the same manner as in Evaluation test 3-1, except that a Kr excimer lamp was used instead of the deuterium lamp 42. A wavelength range of the Ar excimer lamp is 124 to 128 nm, and a peak wavelength thereof is 126 nm. A wavelength range of the Kr excimer lamp is 143 to 148 nm, and a peak wavelength thereof is 145 nm. A difference between Evaluation tests 3-2 and 3-3 and Evaluation test 3-1 may be that light sources used are different from each other as described above, and in Evaluation tests 3-2 and 3-3, a process was performed on a plurality of substrates and the irradiation time period was changed for each substrate. The irradiation time period was set within the range of 0 to 30 seconds. For the resist pattern irradiated with light in each of these tests, LER, LWR, and a film thickness of the resist film were measured.

Figure 17:
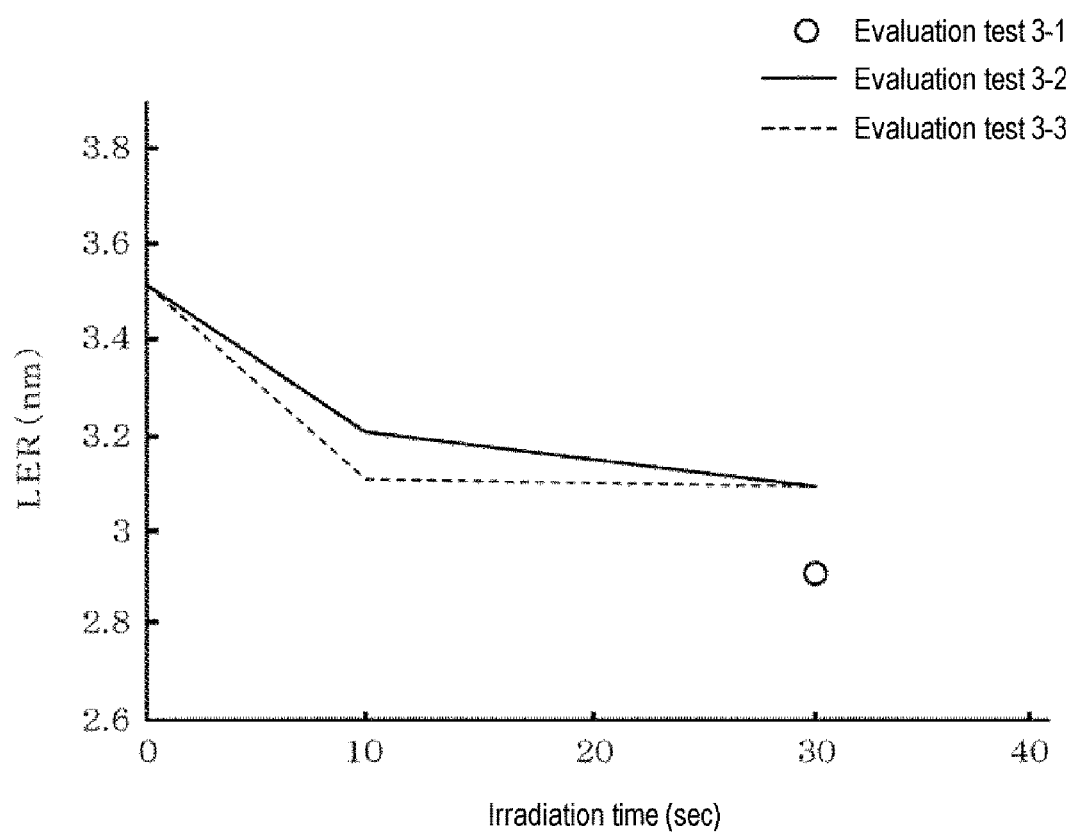
FIG. 17 is a graph showing results of an evaluation test.
Figure 18:
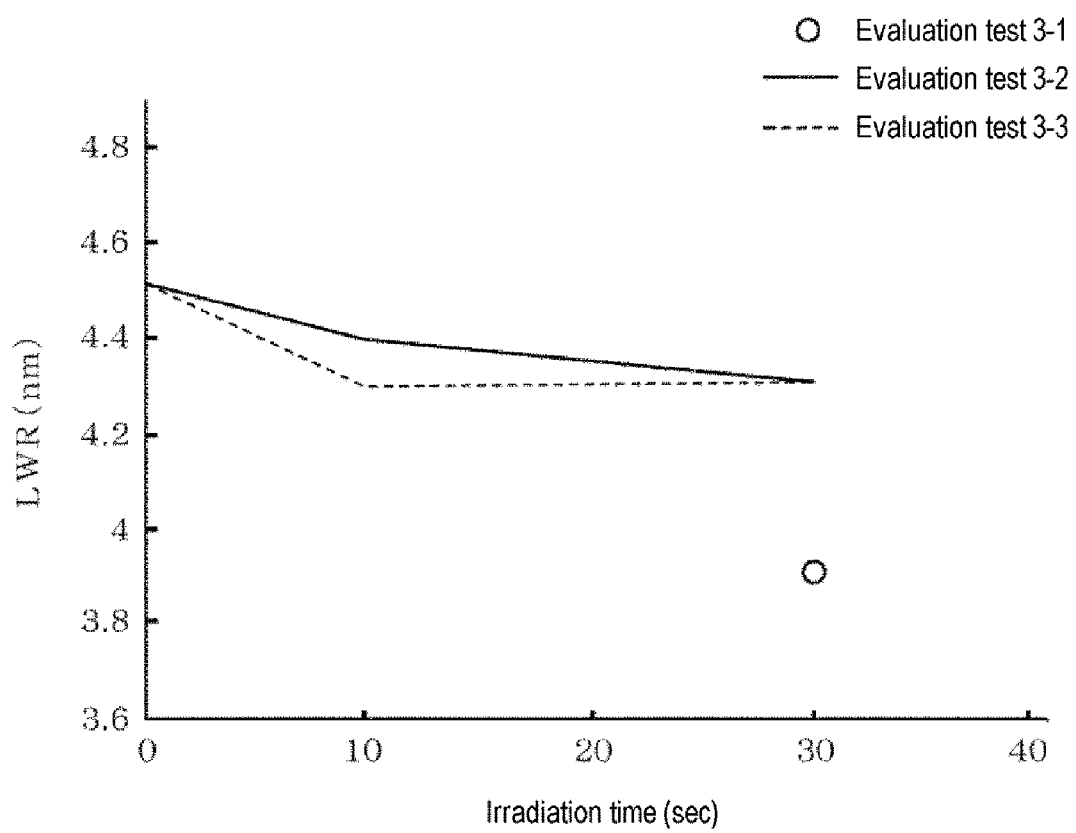
FIG. 18 is a graph showing results of an evaluation test.
Figure 19:
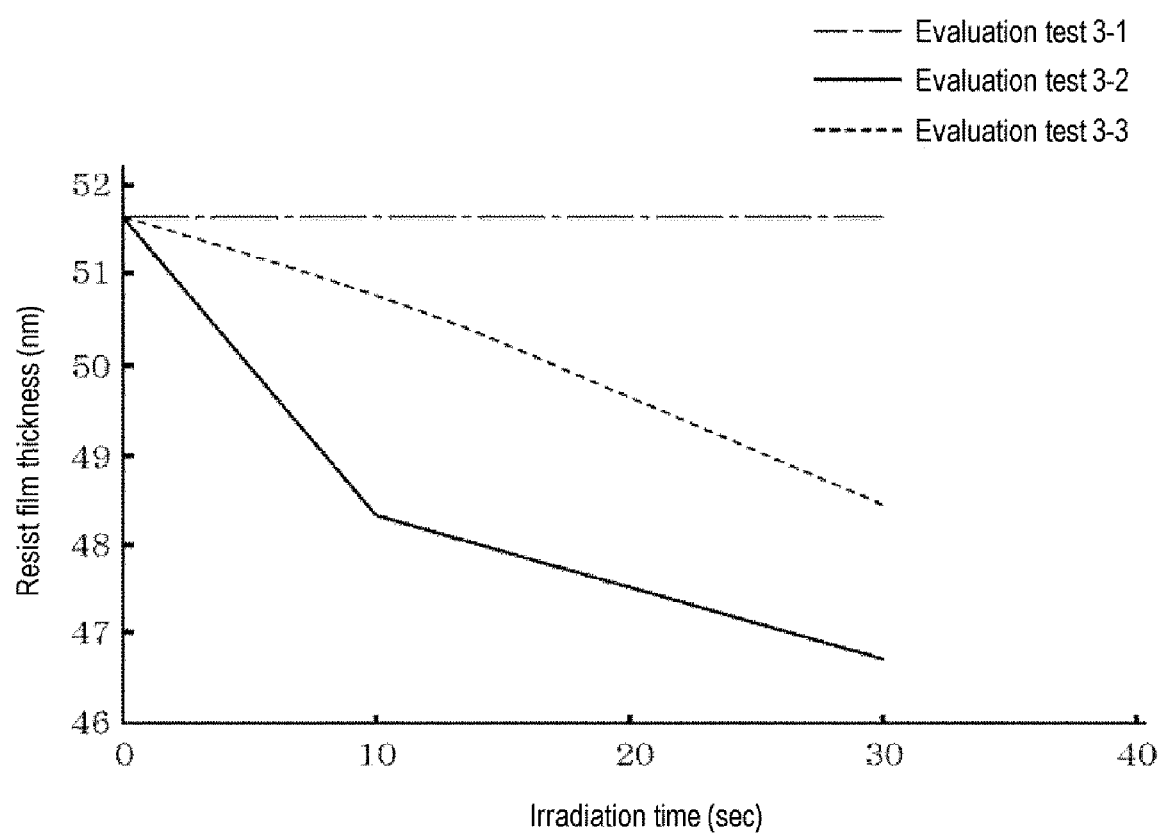
FIG. 19 is a graph showing results of an evaluation test.

FIGS. 17, 18, and 19 are graphs respectively showing results of LER, LWR, and a film thickness of the resist. The vertical axes of the graphs indicate LER, LWR, and a film thickness of the resist, respectively. The unit for each vertical axis is nm. Further, the horizontal axes of the graphs indicate an irradiation time (unit: second) of light from each lamp as a light source. In FIGS. 17 to 19, the results of Evaluation tests 3-2 and 3-3 are indicated by solid lines and dotted lines, respectively. The results of Evaluation test 3-1 are indicated by dots in FIGS. 17 and 18, and by a dashed line in FIG. 19, respectively.

As shown in the graphs of FIGS. 17 and 18, in Evaluation tests 3-2 and 3-3, as the irradiation time period becomes longer, the values of LER and LWR decrease. That is to say, the effect of improving roughness increases. However, when the irradiation time period is 30 seconds, the values of LER and LWR in Evaluation test 3-1 were lower than those in Evaluation tests 3-2 and 3-3. As shown in the graph of FIG. 19, in Evaluation tests 3-2 and 3-3, the film thickness of the resist film becomes smaller as the irradiation time period becomes longer. Furthermore, when the irradiation time of light is 0 to 30 seconds, the film thickness of the resist film in Evaluation test 3-1 was larger than those in Evaluation tests 3-2 and 3-3.

Accordingly, from the results of Evaluation test 3, it was confirmed that the improvement effect of the roughness of the resist pattern can be significantly improved by using the deuterium lamp 42 without decreasing the film thickness of the resist as compared with the case of using the Ar excimer lamp and the Kr excimer lamp. The reason for this result is considered to be that the wavelength of the peak in the spectrum of irradiated light is greater in the deuterium lamp 42 than in the Ar excimer lamp and the Kr excimer lamp. Accordingly, from the results of Evaluation test 3, it is presumed that it is desirable to use a light source having a peak wavelength of 150 nm or more in the spectrum of irradiated light. Furthermore, it is presumed that it is desirable that the spectrum has a relatively wide wavelength range. Specifically, it is considered that it is desirable to use a light source that irradiates near ultraviolet light in addition to vacuum ultraviolet light.

(Evaluation Test 4)

In Evaluation test 4, lights were irradiated onto the resist pattern from light sources which irradiate lights of different wavelengths, respectively, and CD, LWR, LER and a film thicknesses (pattern height) of the resist were measured in the same manner as in Evaluation test 2. In Evaluation test 4-1, a light source having a wavelength of 115 to 400 nm was used. In Evaluation test 4-2, a light source having a wavelength of 160 to 400 nm was used. In Evaluation test 4-3, a light source having a wavelength of 270 to 400 nm was used. Further, in Control test 4, CD, LWR, LER and a film thicknesses of the resist were measured without light irradiation.

Table 2 given below shows results of Evaluation test 4. The unit of each numerical value in Table 2 is nm. As shown in Table 2, there is no large difference in CD for each test. For the film thickness of the resist, the value in Evaluation test 4-3 was slightly lower than that in Control test 4, and the values in Evaluation tests 4-1 and 4-2 were the same as that in Control test 4. For LWR and LER, the values in Evaluation tests 4-2 and 4-3 were substantially the same as those in Control test 4, whereas the values in Evaluation test 4-1 were higher than those in Control test 4. That is to say, in Evaluation test 4-1, the roughness of the surface of the pattern was improved without changing the film thickness of the resist or the magnitude of CD by the light irradiation, namely without changing the overall shape of the pattern. Accordingly, from the results of Evaluation test 4, it was confirmed that it is desirable that VUV light having a wavelength lower than 160 nm is included in light irradiated onto the resist pattern.

TABLE 2

| Unit: nm | Control test 4 (Without irradiation) | Evaluation test 4-1 (115~400) | Evaluation test 4-2 (160~400) | Evaluation test 4-3 (270~400) |
|---|---|---|---|---|
| CD | 38.5 | 39.2 | 40.4 | 41.0 |
| LWR | 4.5 | 3.9 | 4.4 | 4.5 |
| LER | 3.5 | 2.9 | 3.6 | 3.6 |
| Resist film thickness | 78.4 | 78.4 | 78.4 | 77.4 |

(Evaluation Test 5)

In Evaluation test 5-1, the antireflection film 13 was etched in a vacuum atmosphere using a resist pattern irradiated with VUV light as a mask. That is to say, the pattern was transferred onto the antireflection film 13. Then, for the pattern of the antireflection film 13, LER and LWR were measured. Further, Control test 5-1 was conducted as in Evaluation test 5-1 except that a resist pattern not irradiated with VUV light was used as a mask. LER and LWR of the pattern of the antireflection film 13 were measured. From the measured LER and LWR, an LER improvement rate and an LWR improvement rate were calculated in the same manner as in Evaluation test 1.

In addition, in Evaluation test 5-2, etching was performed in a vacuum atmosphere using a resist pattern as a mask until reaching a carbon film as an underlayer of the antireflection film 13, and LER and LWR of the pattern transferred onto the carbon film were measured. Further, in Control test 5-2, a pattern was transferred onto the carbon film, and LER and LWR were measured in the same manner as in Evaluation test 5-2, except that a resist pattern not irradiated with VUV light was used as a mask. From the measured LER and LWR, an LER improvement rate and an LWR improvement rate were calculated in the same manner as in Evaluation test 1.

The LER improvement rate in Evaluation test 5-1 was 17.3%, and the LWR improvement rate was 13.1%. The LER improvement rate in Evaluation test 5-2 was 8.0% and the LWR improvement rate was 7.0%. Accordingly, from the results of Evaluation test 5, it was confirmed that by irradiating the resist pattern with VUV light, the roughness of the pattern of each film to be etched using the resist pattern as a mask was improved. Furthermore, when the same test as in Evaluation test 5-1 and the same test as in Control test 5-1 were conducted, the height of each antireflection film 13 in a state in which the resist pattern was removed by etching was measured. As a result, the height in Evaluation test 5-1 was larger than that in Control test 5-1. The reason for this appears to be that, in Evaluation test 5-1, since the hardened layer 18 described with reference to FIG. 12 was formed by irradiation of the VUV light, the resist pattern is hardly removed. In other words, the test result suggested that the hardened layer 18 was formed.

(Evaluation Test 6)

Figure 20:
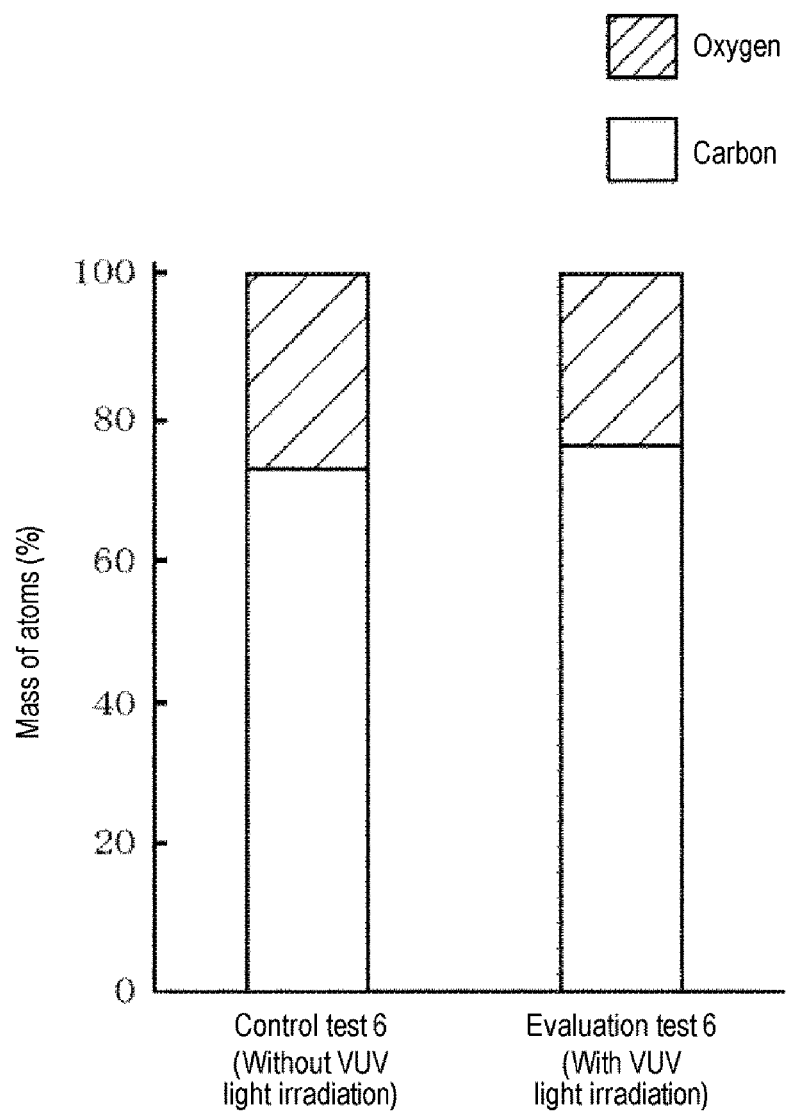
FIG. 20 is a graph showing results of an evaluation test.
Figure 21:
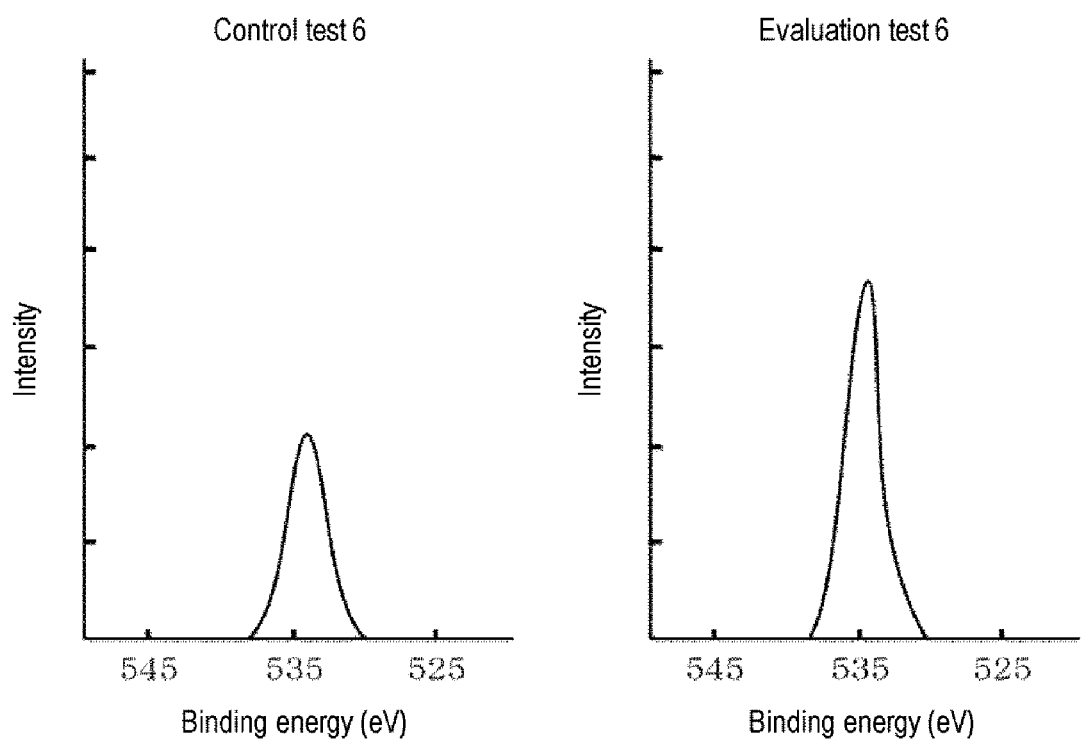
FIG. 21 is a graph showing results of an evaluation test.
Figure 22:
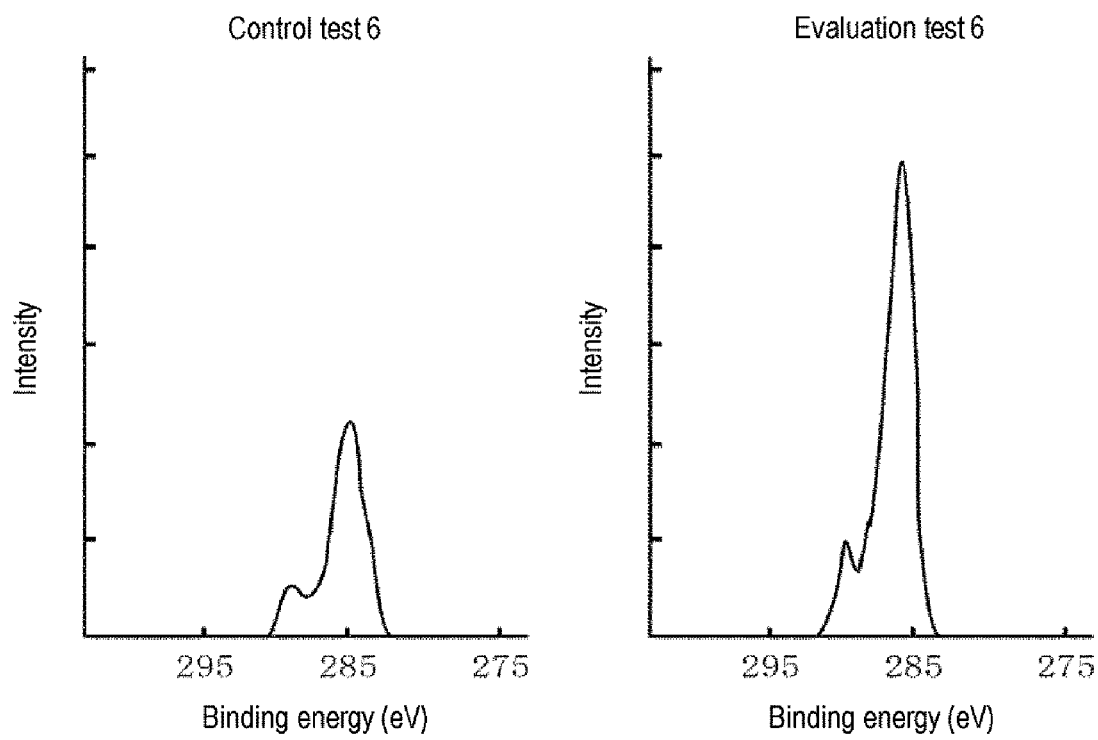
FIG. 22 is a graph showing results of an evaluation test.

In Evaluation test 6, a resist pattern containing PMMA as a material was irradiated with VUV light, and subsequently, X-ray photoelectron spectroscopy (XPS) was performed. Further, in Control test 6, XPS was performed without irradiating the resist pattern with VUV light. Results obtained by XPS are shown in FIGS. 20 to 22. A bar graph of FIG. 20 indicates that, for a ratio between mass % of carbon atoms and mass % of oxygen atoms, the sum of the mass % of the carbon atoms and the mass % of the oxygen atoms is 100%. In Evaluation test 6, the mass % of the carbon atoms and the mass % of the oxygen atoms were respectively 77% and 23%, and in Control test 6, the mass % of the carbon atoms and the mass % of the oxygen atoms were respectively 73% and 27%. That is to say, the mass % of the carbon atoms was increased by irradiating the VUV light.

FIGS. 21 and 22 are spectra showing distribution of binding energy. In each of graphs of FIGS. 21 and 22, the horizontal axis indicates a binding energy (unit:eV) and the vertical axis indicates an intensity (no unit). FIG. 21 shows peaks indicating that oxygen to which two carbons are singly bonded exists in the vicinity of 535 eV, which is referred to as O1s in the spectrum. FIG. 22 shows peaks indicating that a carbon atom to which an oxygen atom is singly bonded and two carbon atoms singly bonded to each other exist in the vicinity of 293 eV to 283 eV, which is referred to as C1s in the spectrum. As is clear from FIGS. 21 and 22, Evaluation test 6 shows larger peaks of O1s and C1s than Control test 6. Accordingly, respective bonds corresponding to these peaks exist in the resist pattern tested in Evaluation test 6 rather than the resist pattern tested in Control test 6. From the results of Evaluation test 6, it is presumed that the ratio of carbons in the resist pattern was increased by irradiating the VUV light and the crosslinking reaction between molecules was generated as described with reference to FIG. 12 to form the hardened layer 18.

(Evaluation Test 7)

In Evaluation test 7, a resist pattern containing PMMA as a material was irradiated with VUV light and each component of the surface free energy was measured. In addition, Fourier transform infrared spectroscopy (FT-IR) was performed on the surface of the resist pattern to obtain an absorption spectrum. Further, in Control test 7, for a resist pattern not irradiated with VUV light, each component of the surface free energy was measured and the absorption spectrum was obtained.

In addition, comparing the absorption spectrum of Evaluation test 7 and the absorption spectrum of Control test 7, a peak near 1,800 $cm^{-1}$ corresponding to a double bond between carbon atoms and oxygen atoms which constitute lactone forming a side chain of PMMA, and a peak near 1,730 $cm^{-1}$ corresponding to a double bond between carbon atoms and oxygen atoms which constitute ester connecting a main chain of PMMA and the lactone were lower in the absorption spectrum of Evaluation test 7. This indicates that dissociation of the side chain of PMMA occurred by irradiation of VUV light.

Figure 23:
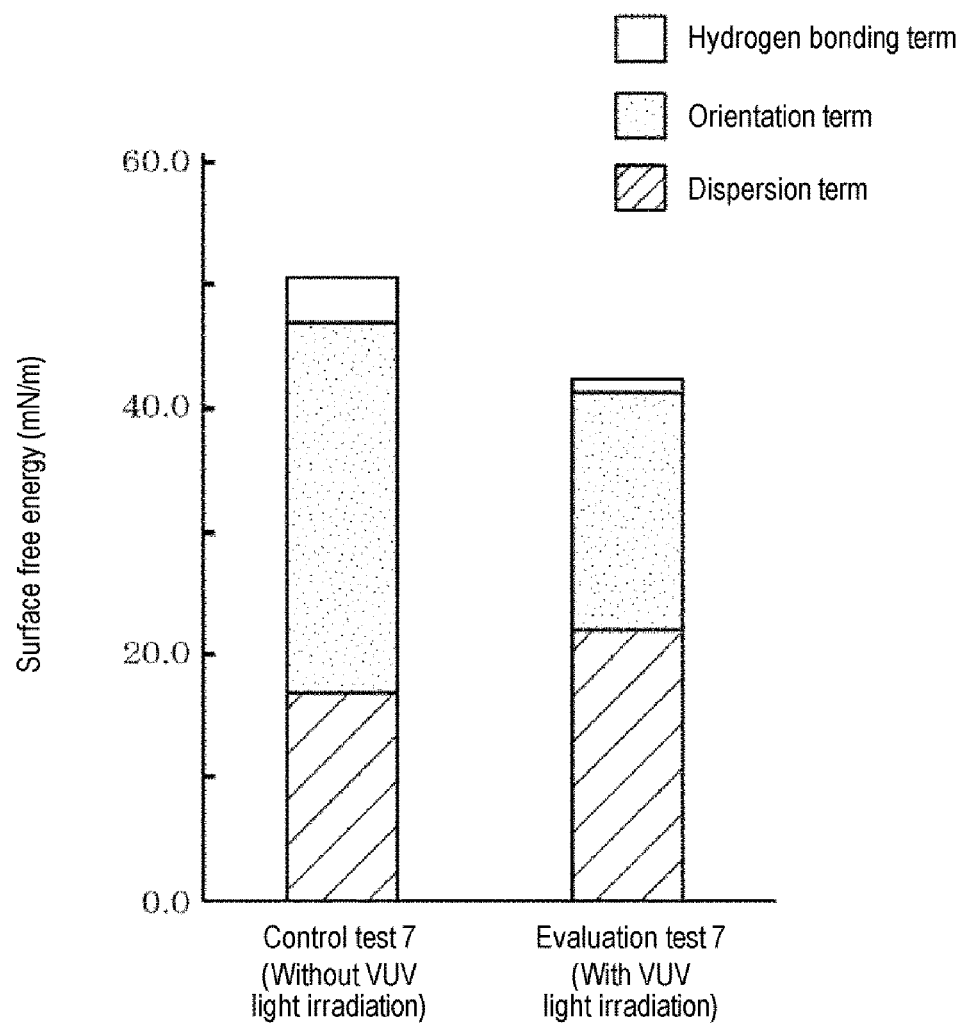
FIG. 23 is a graph showing results of an evaluation test.

FIG. 23 is a bar graph indicating each of hydrogen bonding term, orientation term, and dispersion term, which are components of the surface free energy (unit:mN/m) in Evaluation test 7 and Control test 7. As shown in FIG. 23, the hydrogen bonding term and the orientation term in Evaluation test 7 are smaller than those in Control test 7, and the dispersion term in Evaluation test 7 is larger than that in Control test 7. In addition, a total value of the hydrogen bonding term, the orientation term, and the dispersion term is smaller in Evaluation test 7 than in Control test 7. The reason why the terms are varied and the total value of the terms is lowered by irradiation of VUV light, is considered to be that the internal stress was alleviated in the surface of the resist irradiated with the VUV light. Accordingly, as described above, the dissociation of the side chain was generated by irradiation of the VUV light. As a result, the internal stress in the surface of the resist pattern was alleviated. Thus, it was confirmed that LER and LWR are improved as described in Evaluation tests 1, 2 and the like.

(Evaluation Test 8)

Figure 24:
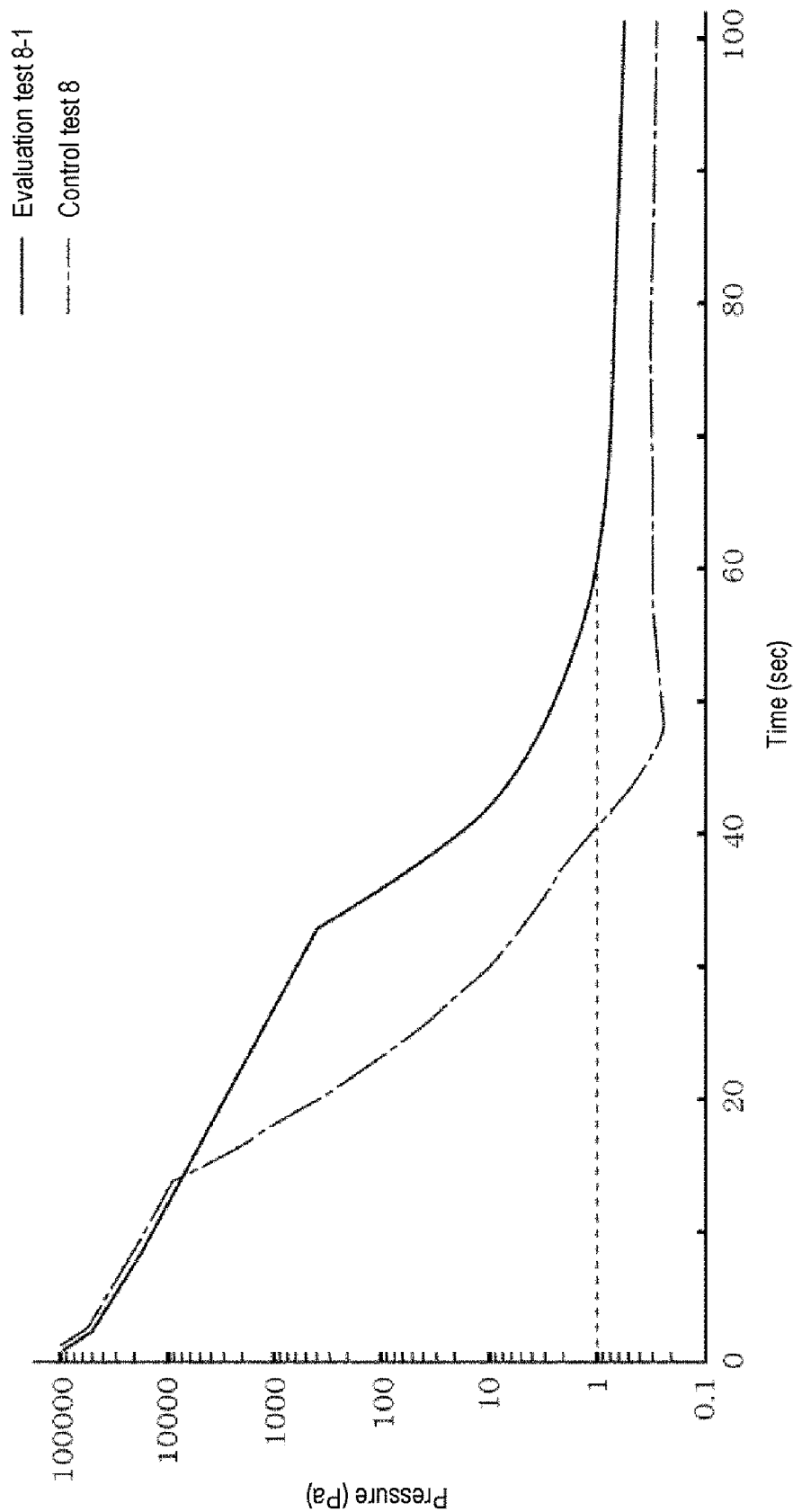
FIG. 24 is a graph showing results of an evaluation test.

Evaluation test 8 was conducted to investigate the influence of exhaust and pressure increase in the process container 21 on the improvement rate of roughness of the resist pattern and the height of the resist pattern. In Evaluation test 8, a test apparatus similar to the substrate processing apparatus 1 in configuration was used. However, an $N_2$ gas was used instead of the Ar gas as the pressure-increasing gas. FIG. 24 is a graph showing an outline of a change in internal pressure of the process container 21 in Evaluation test 8. As in FIG. 7, the vertical axis and the horizontal axis show the internal pressure of the process container 21 and time period, respectively.

In Evaluation test 8-1, the internal pressure of the process container 21 was controlled as shown in a graph indicated by a solid line in FIG. 24. Such a pressure control will be described in more detail. In Evaluation test 8-1, as described at times t1 to t3 in FIG. 7, the internal pressure was decreased such that the average depressurization rate becomes 250 Pa/sec or lower from when the internal pressure of the process container 21 becomes equal to or lower than 10,000 Pa until when the internal pressure reaches 1 Pa. The light irradiation by the deuterium lamps 42 was performed when the internal pressure reaches a predetermined set pressure lower than 1 Pa. The depressurization rate was controlled at a relatively slow level until the internal pressure reaches 400 Pa and was controlled at a relatively fest level when the internal pressure reaches 400 Pa. Further, in Evaluation test 8-2, as in Evaluation test 8-1, the internal pressure of the process container 21 was decreased to become the same set pressure as that in Evaluation test 8-1 as shown in the graph indicated by a solid line in FIG. 24, and subsequently the internal pressure was increased. The light irradiation by the deuterium lamps 42 was performed when the internal pressure becomes 100 Pa.

Further, in Evaluation test 8-3, a step of decreasing the internal pressure of the process container 21 and a step of increasing the internal pressure up to 100,000 Pa were repeatedly as in Evaluation test 8-1, and subsequently, the light irradiation by the deuterium lamps 42 was performed when the internal pressure of the process container 21 becomes 100,000 Pa. That is to say, in Evaluation test 8-3, the process is performed by repeating the pressure decreasing step and the pressure increasing step in the same manner as in the process described with reference to FIG. 13. However, in the process illustrated in FIG. 13, the light irradiation was performed after repeating the pressure decreasing step and the pressure increasing step twice, whereas in Evaluation test 8-3, the light irradiation was performed after repeating five times the pressure decreasing step and the pressure increasing step.

Further, in Control test 8, the pressure decreasing step was performed as in the graph indicated by a dotted line in FIG. 24, and subsequently the light irradiation was performed. Specifically, in Control test 8, the pressure decreasing step was performed at the same depressurization rate as in Evaluation tests 8-1 to 8-3 until the internal pressure of the process container 21 becomes 10,000 Pa, and was performed at an average depressurization rate higher than 250 Pa/sec from when the internal pressure becomes 10,000 Pa or lower until when the internal pressure reaches 1 Pa. Thereafter, the light irradiation was performed. Further, in Control test 8, depending on the configuration of the apparatus, the internal pressure was slightly increased before reaching the set pressure at which the light irradiation is performed. The indication of waveform at the time of increasing the pressure is omitted here. An LER improvement rate and a pattern height change rate were calculated for a resist pattern irradiated with light in the above tests. Here, the LER improvement rate is (LER before process minus LER after process)/LER before process×100(%). Further, the pattern height change rate is (pattern height before process minus pattern height after process)/pattern height before process×100(%).

Figure 25:
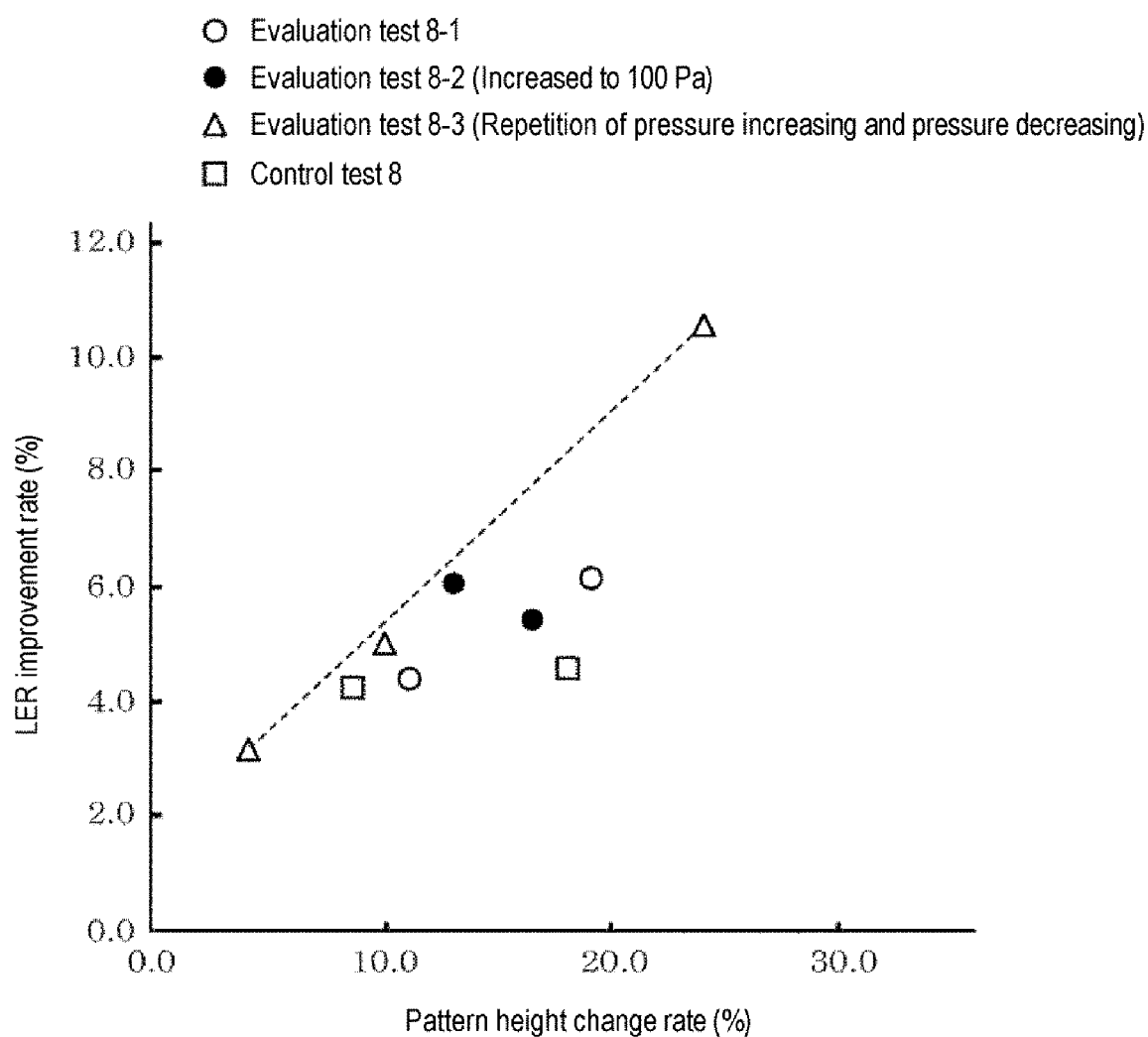
FIG. 25 is a graph showing results of an evaluation test.

FIG. 25 is a graph showing results of Evaluation test 8, in which the vertical axis and the horizontal axis represent an LER improvement rate and a pattern height change rate, respectively. The pattern height change rate is required to be set to 25% or less as a practical level in order to transfer a pattern onto an underlayer. In the graph of FIG. 25, only the result of the pattern height change rate which falls within a range of 25% or less is extracted and shown. In the graph, the results of Evaluation test 8-1 are plotted with white circles, the results of Evaluation test 8-2 are plotted with black circles, the results of Evaluation test 8-3 are plotted with triangles and the results of Control test 8 are plotted with squares. Also, an approximate straight line obtained from the plot of Evaluation test 8-3 is indicated by a dotted line.

As shown in the graph, it can be seen that the LER improvement rate is 5% or less in Control test 8, whereas the LER improvement rate is higher than 5% in Evaluation tests 8-1 to 8-3. Accordingly, it was confirmed that it is effective to decrease the internal pressure at a relatively slow depressurization rate as in Evaluation tests 8-1 to 8-3 in order to improve the LER improvement rate. That is to say, the effect of the present disclosure was manifested. In addition, the LER improvement rate needs to be enhanced while limiting the pattern height change rate. Thus, the plots need to be arranged close to the upper left of the graph. Therefore, it is desirable that the approximate straight line obtained from the plots of the graph is located in the upper portion of the graph, or has a large slope. In the graph, the slope of the approximate straight line is particularly large in Evaluation test 8-3. Accordingly, it was confirmed from Evaluation test 8 that it is more desirable to repeat the pressure decreasing step and the pressure increasing step and to perform the pressure increasing step such that the internal pressure becomes higher than 100 Pa.

(Evaluation Test 9)

In Evaluation test 9, a desirable timing of irradiating a resist pattern with light was investigated using a test apparatus similar to the substrate processing apparatus 1. However, this test apparatus supplies an $N_2$ gas instead of an Ar gas as a pressure-increasing gas. In Evaluation test 9-1, as described with reference to FIG. 7, the interior of the process container 21 was depressurized, and subsequently the light irradiation was performed at time t3 when the pressure became 1 Pa. A period of time from time t1 to time t3 was set to 60 seconds. Further, in Evaluation test 9-2, in the same manner as in Evaluation test 9-1, the interior of the process container 21 was depressurized and was maintained at 1 Pa for 5 minutes from time t3 at which the internal pressure of the process container 21 becomes 1 Pa. Thereafter, an $N_2$ gas was supplied into the process container 21 such that the internal pressure is maintained at a pressure slightly higher than 1 Pa. Then, the light irradiation was performed after 5 minutes from the start of the supply of the $N_2$ gas.

Further, in Evaluation test 9-3, in the same manner as in Evaluation test 9-1, the interior of the process container 21 was depressurized, and subsequently the interior of the process container 21 was maintained at 1 Pa. The light irradiation was performed after 10 minutes from time t3 at which the internal pressure of the process container 21 reaches 1 Pa. Further, in Evaluation test 9-4, in the same manner as in Evaluation test 9-1, the interior of the process container 21 was depressurized, and subsequently the internal pressure of the process container 21 was increased up to 100,000 Pa. After such pressure decreasing and pressure increasing steps were repeatedly performed five times, the light irradiation was performed. For each resist pattern irradiated with light in Evaluation tests 9-1 to 9-4, an LER improvement rate and a pattern height change rate were measured in the same manner as in the Evaluation test 8.

Figure 26:
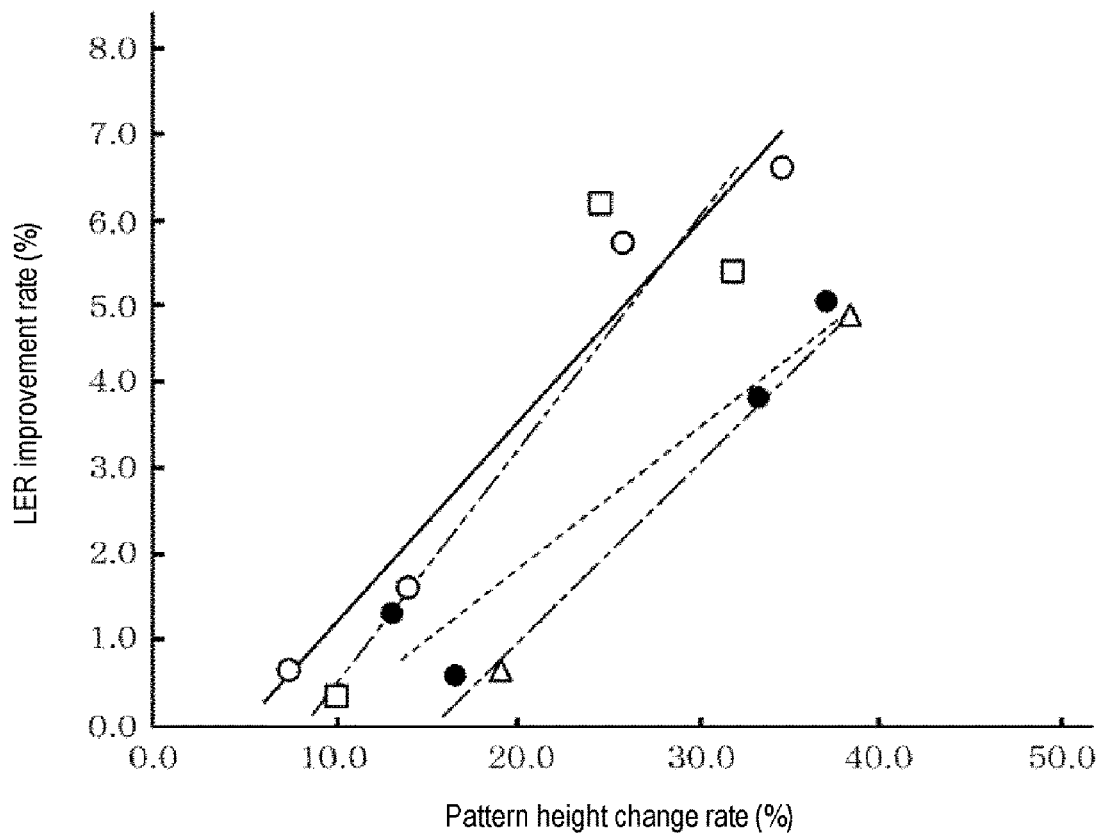
FIG. 26 is a graph showing results of an evaluation test.

A graph of FIG. 26 shows results of Evaluation test 9. Similar to the graph of FIG. 25, the vertical axis and the horizontal axis indicate an LER improvement rate and a pattern height change rate, respectively. In the graph, the results of Evaluation test 9-1 are plotted with white circles, the results of Evaluation test 9-2 are plotted with black circles, the results of Evaluation test 9-3 are plotted with triangles, and the results of Evaluation test 9-4 are plotted with squares. Furthermore, approximate straight lines obtained from respective plots are indicated by a solid line for Evaluation test 9-1, a dotted line for Evaluation test 9-2, a dashed dotted line for Evaluation test 9-3, and a dashed double-dotted line for Evaluation test 9-4, respectively. The slopes of the approximate straight lines are larger in the order of Evaluation test 9-4>Evaluation test 9-1>Evaluation test 9-2>Evaluation test 9-3. The reason why the improvement effect of the Evaluation test 9-3 among Evaluation tests 9-1 to 9-4 was low is as follows. Since the resist pattern was exposed to a vacuum environment having a low pressure for a relatively long period of time, molecules having a low molecular weight, which are required to maintain the fluidity of the resist pattern, were excessively desorbed, which deteriorates the fluidity of the surface of the resist pattern, as described with reference to FIG. 8 and the like. Therefore, it was confirmed from Evaluation test 9 that it is desirable to promptly irradiate light or to increase the internal pressure after the internal pressure reaches 1 Pa. In addition, the slopes in Evaluation tests 9-4 and 9-1 are larger than that in Evaluation test 9-2. Accordingly, it was also confirmed that it is more desirable to increase the internal pressure after the internal pressure reaches 1 Pa.

(Evaluation Test 10)

Figure 27:
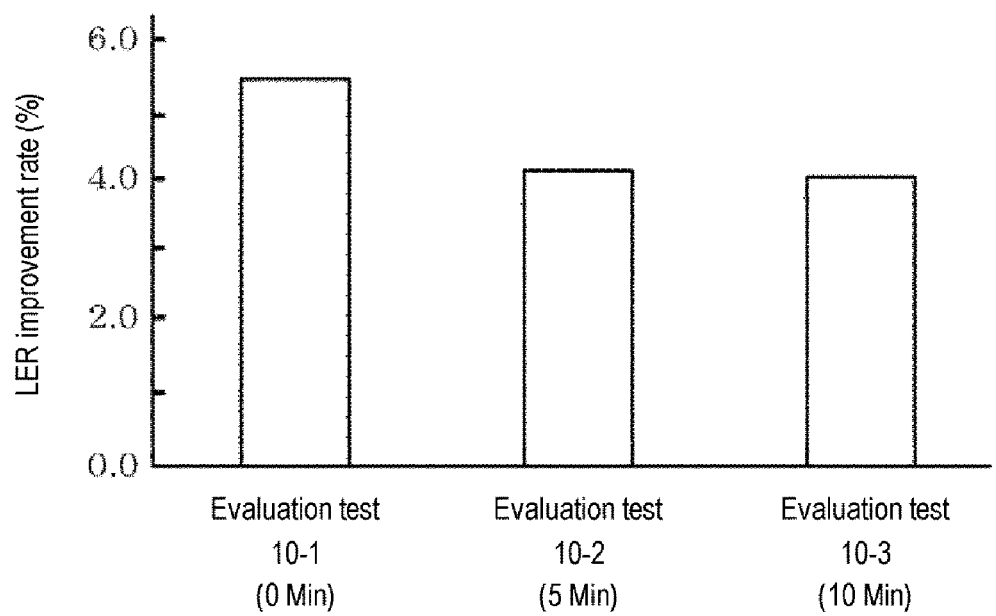
FIG. 27 is a graph showing results of an evaluation test.

The interior of the process container 21 was depressurized to have a predetermined pressure lower than 1 Pa, and subsequently, the light irradiation was performed on the resist pattern. A period of time from when the internal pressure reaches the predetermined pressure till when the light irradiation is performed was changed for each test. The period of time until the light irradiation is performed was set to 0 second in Evaluation test 10-1, the period of time until the light irradiation is performed was set to 5 minutes in Evaluation test 10-2, and the period of time until the light irradiation is performed was set to 10 minutes in Evaluation test 10-3. For the resist patterns of Evaluation tests 10-1 to 10-3, an LER improvement rate was calculated in the same manner as in Evaluation test 9. A bar graph of FIG. 27 shows results of Evaluation test 10. The LER improvement rate in the Evaluation test 10-1 was relatively higher than that in Evaluation tests 10-2 and 10-3, whereas the LER the improvement rates in Evaluation tests 10-2 and 10-3 were lower than that in the Evaluation test 10-1, which were substantially the same improvement rates as each other.

From Evaluation test 10, it was shown that as the period of time of exposure to a relatively low pressure atmosphere becomes longer, the LER improvement rate decreases. Moreover, from Evaluation test 10, it can be seen that it is desirable to promptly irradiate light when the internal pressure reaches the predetermined pressure of 1 Pa or lower and then is not further increased. Accordingly, it is desirable to irradiate light within, for example, 10 seconds as described above, after reaching the pressure of 1 Pa.

(Evaluation Test 11)

Evaluation test 11 was conducted to measure a change in pressure around a substrate on which a resist pattern is formed and to investigate a change in the amount of a gas released from the resist pattern during the irradiation of light onto the resist pattern and before and after the light irradiation. In Evaluation test 11, an experimental apparatus for test configured to receive the substrate with the resist pattern formed thereon in the process container, heat the substrate to a temperature lower than 200 degrees C. in a vacuum atmosphere, and irradiate with extreme ultraviolet (EUV) light, was used. Inside the process container of such an experimental apparatus, a cover was installed around the substrate so as not to hinder the irradiation of the EUV light onto the substrate. This experimental apparatus is connected to an inspection apparatus and can transfer the cover into an inspection container constituting the inspection apparatus under a vacuum atmosphere. Inside the inspection container, the cover is heated in an $N_2$ gas atmosphere. The experimental apparatus detects a change in pressure, which is caused when the gas is released from the resist pattern and adheres onto the cover. With the aforementioned experimental apparatus, light irradiation was performed on a plurality of substrates under the same conditions. Then, a timing at which the cover is unloaded from the experimental apparatus was changed every process, and a change in internal pressure of the inspection container described above was detected. Based on the change in internal pressure of the inspection container, a change in pressure around the substrate during the process of the substrate in the experimental apparatus was calculated.

Figure 28:
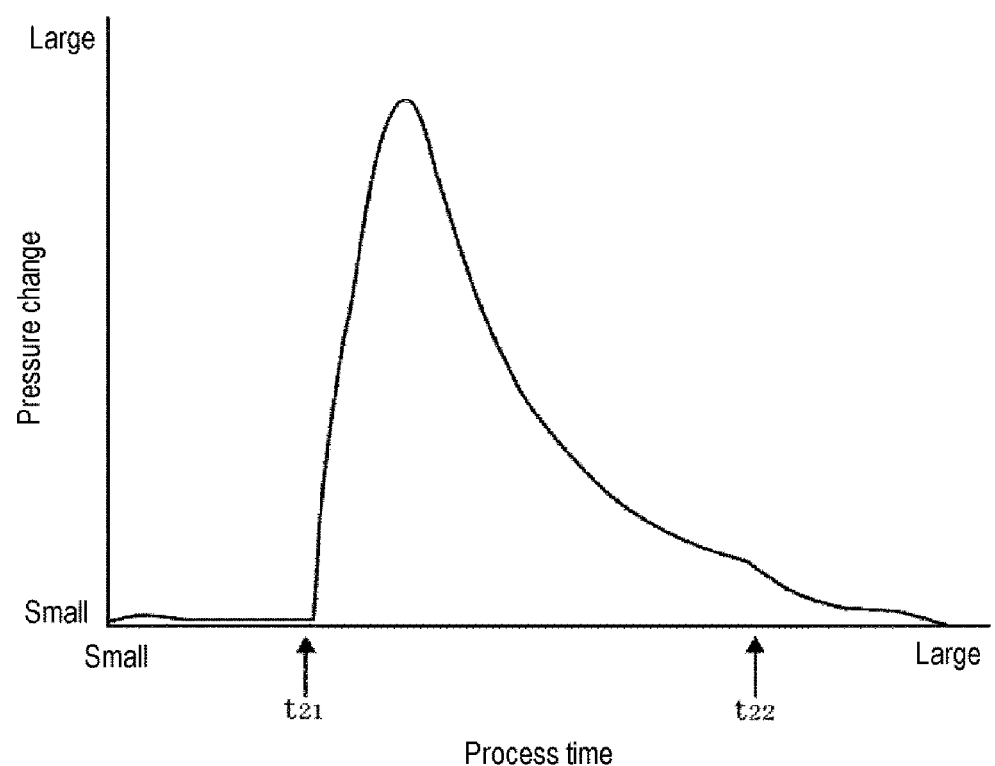
FIG. 28 is a graph showing results of an evaluation test.

A graph of FIG. 28 shows results of Evaluation test 11. In FIG. 28, the vertical axis of the graph indicates a change in pressure around the substrate, which corresponds to the amount of a gas generated from the resist. The horizontal axis of the graph indicates a process time. Times t21 and t22 on the horizontal axis indicate a start time and a stop time of irradiation of EUV light, respectively. As is apparent from the graph, when the irradiation of EUV light starts, a release amount of a gas rapidly increases, and subsequently, gradually decreases until the irradiation of EUV light is stopped. It is presumed that the same result will be obtained even when the VUV light is irradiated instead of the EUV light. As described above, when the resist pattern is irradiated with light in a vacuum atmosphere, a gas is released. Thus, it is estimated that it is effective to decrease the internal pressure of the process container to 1 Pa or lower and subsequently increase the internal pressure, from the viewpoint of suppressing a change in the overall shape of the resist pattern due to the release of the gas.

(Evaluation Test 12)

Figure 29:
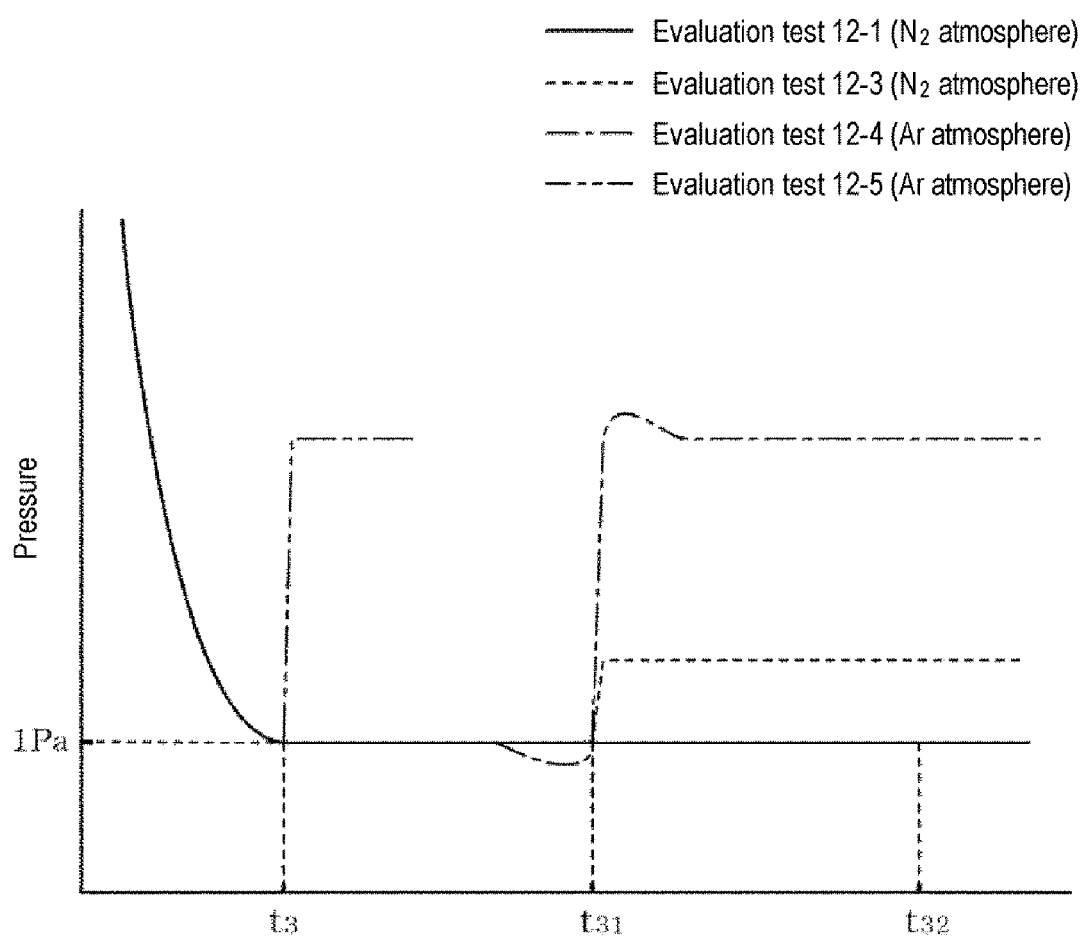
FIG. 29 is a graph showing results of an evaluation test.

The influence of atmosphere around the substrate when light irradiation was performed from the deuterium lamps 42 onto the resist pattern for 30 seconds was investigated. FIG. 29 is a graph showing a change in internal pressure of the process container 21 as in FIG. 7. Evaluation tests 12-1, 12-3, 12-4, and 12-5 as described hereinbelow are indicated by solid lines, dotted lines, dashed dotted lines, dashed double-dotted lines, respectively. In Evaluation test 12-1, as described with reference to FIG. 7, the internal pressure of the process container 21 was decreased. After time t3 at which the internal pressure becomes 1 Pa, an $N_2$ gas was supplied into the process container 21 to maintain the internal pressure at 1 Pa. The light irradiation was performed in an $N_2$ atmosphere at time t32 lapsed after 10 minutes from time t3. In Evaluation test 12-2, in the same manner as in Evaluation test 12-1, the interior of the process container 21 was depressurized, and the light irradiation was performed at time t3 at which the internal pressure becomes 1 Pa.

In Evaluation test 12-3, in the same manner as in the Evaluation test 12-1, the interior of the process container 21 was depressurized to have a pressure of 1 Pa. The internal pressure was maintained at 1 Pa after time t3 at which the internal pressure becomes the pressure of 1 Pa. The internal pressure of the process container 21 was increased by supplying an $N_2$ gas at time t31 lapsed after 5 minutes from time t3, so that the internal pressure was maintained at a pressure higher than 1 Pa. The light irradiation was performed in an $N_2$ atmosphere at time t32 lapsed after 5 minutes from time t31. In Evaluation test 12-4, in the same manner as in Evaluation test 12-1, the interior of the process container 21 was depressurized to be maintained at 1 Pa. Thereafter, at time t31, the internal pressure of the process container 21 was increased by an Ar gas and the interior of the process container 21 was maintained at a pressure higher than 1 Pa. At time t32, the light irradiation was performed in an Ar gas atmosphere. The pressure in the time interval between time t31 and time t32 in Evaluation test 12-4 was set at a pressure higher than the pressure in the time interval between time t31 and time t32 in Evaluation test 12-3. In Evaluation test 12-5, in the same manner as in Evaluation test 12-1, the interior of the process container 21 was depressurized, and the internal pressure of the process container 21 was increased by supplying an Ar gas at time t3 at which the internal pressure becomes 1 Pa. Thereafter, the interior of the process container 21 was maintained at the same pressure as at the time interval between times t31 and t32 in Evaluation test 12-4. The light irradiation was performed in an Ar gas atmosphere.

Figure 30:
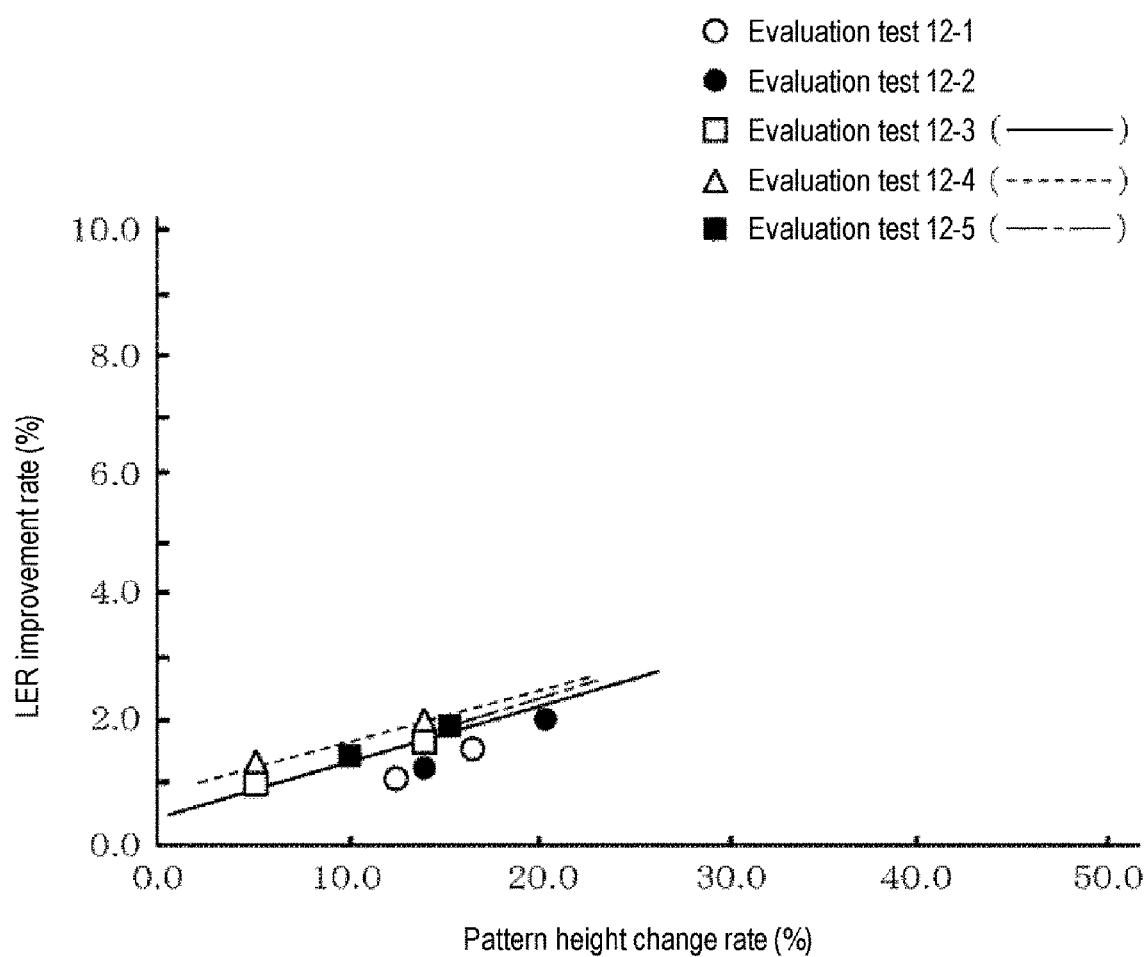
FIG. 30 is a graph showing results of an evaluation test.

An LER improvement rate and a pattern change rate of the resist pattern in each of Evaluation tests 12-1 to 12-5 were measured. A graph of FIG. 30 shows such measurement results. In the graph of FIG. 30, similar to the graph of FIG. 25 in Evaluation test 8, the vertical axis indicates an LER improvement rate and the horizontal axis indicates a pattern height change rate. Similar to the graph of FIG. 25 in Evaluation test 8, the result of the pattern height change rate of 25% or more is omitted. In the graph, the results of Evaluation tests 12-1, 12-2, 12-3, 12-4, and 12-5 are plotted with white circles, black circles, white squares, triangles, and black squares, respectively. Further, for Evaluation tests 12-3, 12-4, and 12-5, approximate straight lines obtained from the plots are indicated by a solid line, a dotted line, and a dashed dotted line, respectively.

From the graph, it was confirmed from Evaluation test 12 that since the plots of Evaluation tests 12-3 to 12-5 in which the pressure increasing step was performed are located at the upper left of the graph, as compared with the plots of Evaluation tests 12-1 and 12-2 in which the pressure increasing step was not performed, a higher LER improvement rate can be obtained while suppressing a change in height of the pattern by decreasing the internal pressure of the process container 21 and subsequently decreasing the internal pressure. Moreover, the approximate straight lines of Evaluation tests 12-4 and 12-5 are located at the upper side of the graph as compared with the approximate straight line of Evaluation test 12-3. In other words, it was confirmed that it is more desirable to use an Ar gas as the pressure-increasing gas from the viewpoint of obtaining a high LER improvement rate while suppressing a change in height of the pattern.

According to the present disclosure in some embodiments, when depressurizing the interior of a process container to perform a process of improving roughness of the surface of a pattern mask with vacuum ultraviolet light, a rapid change in pressure is suppressed in a relatively low pressure atmosphere. Thus, it is possible to prevent molecules constituting the pattern mask from being desorbed from the pattern mask, and to improve the roughness of the surface while suppressing a change in the overall shape of the pattern mask.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a mounting table configured to mount a substrate with a pattern mask formed on the substrate inside a process container;
   a depressurization mechanism configured to perform a pressure-decreasing process of depressurizing an interior of the process container to have a pressure of 1 Pa or less and 0 Pa or more;
   a light irradiation mechanism configured to irradiate the substrate with a vacuum ultraviolet light after the interior of the process container is depressurized so that an internal pressure of the process container reaches a pressure of 1 Pa or less and 0 Pa or more; and
   a controller configured to output a control signal such that an average depressurization rate inside the process container performed by the depressurization mechanism becomes 250 Pa/sec or less and more than 0 Pa/sec while the interior of the process container is depressurized from 10,000 Pa to 1 Pa.

2. The apparatus of claim 1, wherein the vacuum ultraviolet light irradiated from the light irradiation mechanism includes light having a wavelength lower than 160 nm.

3. The apparatus of claim 1, wherein the light irradiation mechanism is configured by a deuterium lamp.

4. The apparatus of claim 1, wherein a period of time during which the interior of the process container is depressurized from 10,000 Pa to 1 Pa is 60 seconds or lower.

5. The apparatus of claim 1, further comprising: a pressure-increasing gas supply mechanism configured to perform a pressure-increasing process of increasing the internal pressure of the process container by supplying a pressure-increasing gas into the process container after the internal pressure of the process container reaches the pressure of 1 Pa or less and 0 Pa or more,
   wherein the irradiation of the vacuum ultraviolet light by the light irradiation mechanism is performed after the pressure-increasing process.

6. The apparatus of claim 5, wherein the pressure-decreasing process performed by the depressurization mechanism and the pressure-increasing process performed by the pressure-increasing gas supply mechanism are alternately repeated.

7. The apparatus of claim 5, wherein the pressure-increasing gas is an argon gas.

8. A substrate processing method, comprising:
   mounting a substrate with a pattern mask formed on the substrate inside a process container;
   depressurizing an interior of the process container;
   irradiating the substrate with a vacuum ultraviolet light after the interior of the process container is depressurized to have a pressure of 1 Pa or less and 0 Pa or more in the depressurizing; and
   controlling an average depressurization rate inside the process container performed in the depressurizing to become 250 Pa/sec or less and more than 0 Pa/sec while the interior of the process container is depressurized from 10,000 Pa to 1 Pa.

9. The method of claim 8, wherein the irradiating a vacuum ultraviolet light includes hardening a surface of the pattern mask.

10. A non-transitory computer-readable storage medium storing a computer program used in a substrate processing apparatus for improving a roughness of a pattern mask formed on a surface of a substrate,
    wherein the computer program includes a group of steps organized to execute the substrate processing method of claim 8.

* * * * *